(12) United States Patent
Yoshihara et al.

(10) Patent No.: US 10,461,010 B2
(45) Date of Patent: Oct. 29, 2019

(54) POWER MODULE, POWER SEMICONDUCTOR DEVICE AND POWER MODULE MANUFACTURING METHOD

(71) Applicant: MITSUBISHI ELECTRIC CORPORATION, Chiyoda-ku, Tokyo (JP)

(72) Inventors: Hiroyuki Yoshihara, Tokyo (JP); Dai Nakajima, Tokyo (JP); Masaki Goto, Tokyo (JP); Kiyofumi Kitai, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/070,839

(22) PCT Filed: Mar. 27, 2017

(86) PCT No.: PCT/JP2017/012257
§ 371 (c)(1),
(2) Date: Jul. 18, 2018

(87) PCT Pub. No.: WO2017/175612
PCT Pub. Date: Oct. 12, 2017

(65) Prior Publication Data
US 2019/0067154 A1    Feb. 28, 2019

(30) Foreign Application Priority Data

Apr. 4, 2016  (JP) .................................. 2016-074887

(51) Int. Cl.
*H01L 29/15* (2006.01)
*H01L 23/367* (2006.01)
(Continued)

(52) U.S. Cl.
CPC ............ *H01L 23/367* (2013.01); *H01L 21/56* (2013.01); *H01L 23/28* (2013.01); *H01L 23/29* (2013.01);
(Continued)

(58) Field of Classification Search
CPC ............... H01L 23/367; H01L 23/3107; H01L 23/4006; H01L 23/49568; H01L 21/56
(Continued)

(56) References Cited

U.S. PATENT DOCUMENTS

2003/0197255 A1    10/2003    Nakajima et al.
2004/0089931 A1     5/2004    Nakajima et al.
(Continued)

FOREIGN PATENT DOCUMENTS

JP    53-108872 U    8/1978
JP    2003-031765 A  1/2003
(Continued)

OTHER PUBLICATIONS

International Search Report (PCT/ISA/210) dated Jun. 6, 2017, by the Japanese Patent Office as the International Searching Authority for International Application No. PCT/JP2017/012257.
(Continued)

*Primary Examiner* — Tu-Tu V Ho
(74) *Attorney, Agent, or Firm* — Buchanan Ingersoll & Rooney PC

(57) ABSTRACT

The power module of the invention includes a power element, a metal base for dissipating heat from the power element, a lead frame electrically connected to electrodes of the power element, and a resin enclosure that encapsulates the power element so that one surface of the metal base and a part of the lead frame are exposed from the enclosure. The resin enclosure of the power module includes: a body portion in which the power element and a part of the lead
(Continued)

frame are placed, and at a bottom surface of which the one surface of the metal base is exposed; and a rib portion which is placed on the bottom surface of the body portion so as to surround an outer periphery of the metal base, and is formed to protrude from the bottom surface of the body portion in a direction perpendicular to the bottom surface.

22 Claims, 13 Drawing Sheets

(51) Int. Cl.
| | |
|---|---|
| *H01L 23/28* | (2006.01) |
| *H01L 23/29* | (2006.01) |
| *H01L 25/07* | (2006.01) |
| *H01L 25/18* | (2006.01) |
| *H01L 21/56* | (2006.01) |
| *H01L 23/31* | (2006.01) |
| *H01L 23/40* | (2006.01) |
| *H01L 23/495* | (2006.01) |

(52) U.S. Cl.
CPC ...... *H01L 23/3107* (2013.01); *H01L 23/4006* (2013.01); *H01L 23/49568* (2013.01); *H01L 25/07* (2013.01); *H01L 25/18* (2013.01); *H01L 2224/48091* (2013.01); *H01L 2224/48139* (2013.01); *H01L 2224/48247* (2013.01); *H01L 2924/181* (2013.01); *H01L 2924/1815* (2013.01)

(58) Field of Classification Search
USPC .......................................................... 257/77
See application file for complete search history.

(56) References Cited

U.S. PATENT DOCUMENTS

| | | | |
|---|---|---|---|
| 2006/0055027 A1* | 3/2006 | Kitabatake | .......... H01L 23/3672 257/706 |
| 2008/0106160 A1 | 5/2008 | Yoshinari et al. | |
| 2009/0152714 A1 | 6/2009 | Yamagishi et al. | |
| 2012/0223444 A1 | 9/2012 | Yamagishi et al. | |
| 2012/0236503 A1 | 9/2012 | Asada et al. | |
| 2014/0001613 A1* | 1/2014 | Ha | .......... H01L 23/24 257/675 |
| 2014/0217620 A1 | 8/2014 | Yamagishi et al. | |
| 2016/0351480 A1 | 12/2016 | Fushie et al. | |
| 2017/0301633 A1 | 10/2017 | Kobayashi et al. | |

FOREIGN PATENT DOCUMENTS

| | | |
|---|---|---|
| JP | 2003-100987 A | 4/2003 |
| JP | 2004-165406 A | 6/2004 |
| JP | 2008-118067 A | 5/2008 |
| JP | 2010-050323 A | 3/2010 |
| JP | 2012-195492 A | 10/2012 |
| JP | 2016-076563 A | 5/2016 |
| WO | WO 2015/145752 A1 | 10/2015 |

OTHER PUBLICATIONS

Written Opinion (PCT/ISA/237) dated Jun. 6, 2017, by the Japanese Patent Office as the International Searching Authority for International Application No. PCT/JP2017/012257.

\* cited by examiner

POWER MODULE, POWER SEMICONDUCTOR DEVICE AND POWER MODULE MANUFACTURING METHOD

TECHNICAL FIELD

The present invention relates to a power module and a power semiconductor device provided with the power module and a heatsink.

BACKGROUND ART

Power modules are used for controlling main power (power controlling) in wide variety of apparatuses from industrial apparatuses to home electronics and information terminals. One set of examples of the power modules include inverters for converting DC power into AC power, and the like. Since such power modules are to be operated under a large current and a high voltage, it is thought to be essential that they ensure high electrical insulation and that they allow heat generated due to the operation to efficiently escape outside the power modules.

For example, in Patent Document 1, a power semiconductor device (power module) is disclosed in which multiple power semiconductor elements (power elements) are bonded to a heat dissipation plate by using a solder and are encapsulated by a molded resin enclosure. The power semiconductor device of Patent Document 1 is sandwiched between: a retainer plate that is placed on an upper surface of the molded resin enclosure; and a heat-dissipation fin (heatsink) that is in contact, through a thermally conductive grease, with the bottom surface where the heat dissipation plate (metal base) is exposed; and the power semiconductor device is fixed to the heat dissipation fin by means of a bolt inserted in a through-hole formed in the retainer plate, the molded resin enclosure and the heat dissipation plate. Further, in the power semiconductor device of Patent Document 1, respective one ends of a plate-like wiring member (lead frame) connected to electrodes of the multiple semiconductor elements, are projecting, as outside electrodes, from lateral surfaces of the molded resin enclosure. The front surface electrodes of the semiconductor elements are connected to the wiring member by way of wires and the rear surface electrodes of the semiconductors are connected to the wiring member by way of the heat dissipation plate. Meanwhile, in each of a semiconductor module (power module) in Patent Document 2 and a power module in Patent Document 3, respective end portions of an exposed material member exposed at the surface placed toward the heat dissipation plate, are each covered with an encapsulation resin to form a rib.

CITATION LIST

Patent Document

Patent Document 1: Japanese Patent Application Laid-open No. 2004-165406 (Paragraphs 0010 to 0016 and FIG. 7)
Patent Document 2: International Patent Application Publication No. WO2015/145752 A1 (FIG. 3, FIG. 8 and FIG. 13)
Patent Document 3: Japanese Patent Application Laid-open No. 2003-31765 (FIG. 1)

SUMMARY OF THE INVENTION

Problems to be Solved by the Invention

For such a power module in which, like the power module in Patent Document 1, power elements connected to a metal base are encapsulated with a resin, it is required to insulate its outside electrode provided as one end of the lead frame connected to the front surface electrodes of the power elements, from the metal base connected to the rear surface electrode of the power element. The insulation distance between the lead frame projecting from the resin and the metal base exposed out of the resin, is determined by a creepage distance of the resin between the lead frame and the metal base. Thus, in order to ensure a necessary insulation distance, the distance between the outer periphery of the metal base and the outer periphery of the resin is to be secured sufficiently. The larger the electric power of the power module, the larger the insulation distance required according to the power dealt with, so that, in order to ensure a larger insulation distance, it is required to make the distance between the lead frame and the metal base longer, namely, to laterally broaden the power module. As a result, there is a problem that the area of the power module increases and thus the power module is enlarged.

Such a case may arise where the power module is warped, at its end portions, with reference to the plane of the metal base of the power module to form a dented shape. It is known that, in that case, if the power module is large in size, thermal contraction of the encapsulation resin is large and thus the warpage amount tends to be large. When the warpage amount of the power module becomes larger, with respect to the metal base of the power module, its area in contact with the heatsink becomes smaller, so that a problem arises in that the heat generated by the power element can not be efficiently transferred to the heatsink and thus the chip temperature of the power element increases. Accordingly, for the large-size power module, it is required to take a special measure for dissipating the heat. As an example of the special measure for dissipating the heat in the power module, such a method is conceivable in which the warpage of the power module is restrained by pressing, to thereby make the contact area between the metal base of the power module and the heatsink larger. In order that the metal base of the power module may make contact with the heatsink over a large contact area, namely, in order to restrain the warpage of the power module, a retaining member, such as the retainer plate in Patent Document 1 is required and thus, there is a problem that the step for fixing the power module to the heatsink spends more time and is complicated.

Meanwhile, as shown in Patent Document 2, it is possible to increase the amount of the encapsulation resin by forming the rib or the like, at the end portion of the power module; however, there is a problem that when the width of the rib is made wider, the power module is enlarged. On the other hand, the power module is warped with reference to the plane of the metal base. This becomes significant in particular when the module becomes large in size, because the module is affected by the contraction ratio of the resin. At a portion of the bottom surface that is placed on the end portion of a power module as shown in Patent Document 3, it is difficult to control the warpage amount. Thus, it is required to strictly manage a linear expansion difference between the encapsulation resin and the frame member, resulting in a reduced margin for manufacturing.

This invention has been made to solve the problems as described above, and an object thereof is to provide a small-size power module while enhancing electrical insulation between the lead frame and the metal base.

Means for Solving the Problems

A power module of the invention comprises a power element, a metal base for dissipating heat from the power element, a lead frame electrically connected to electrodes of the power element, and a resin enclosure that encapsulates the power element so that one surface of the metal base and a part of the lead frame are exposed from the enclosure, said resin enclosure characterized by comprising: a body portion in which the power element and a part of the lead frame are placed, and at a bottom surface of which said one surface of the metal base is exposed; and a rib portion which is placed on the bottom surface of the body portion so as to surround an outer periphery of the metal base, and is formed to protrude from the bottom surface of the body portion in a direction perpendicular to the bottom surface; wherein the body portion has a shape upwardly convex with respect to said exposed one surface of the metal base as a vertical reference.

Effect of the Invention

According to the power module of the invention, the body portion has a shape upwardly convex with respect to the exposed one surface of the metal base as a vertical reference, and is provided with the rib portion which is placed on the bottom surface of the body portion in the resin enclosure so as to surround the outer periphery of the metal base, and is formed to protrude from the bottom surface of the body portion in a direction perpendicular to the bottom surface. Thus, it is possible to make the power module smaller while enhancing the insulation between the lead frame and the metal base.

MODES FOR CARRYING OUT THE INVENTION

Embodiment 1

Figure 1:
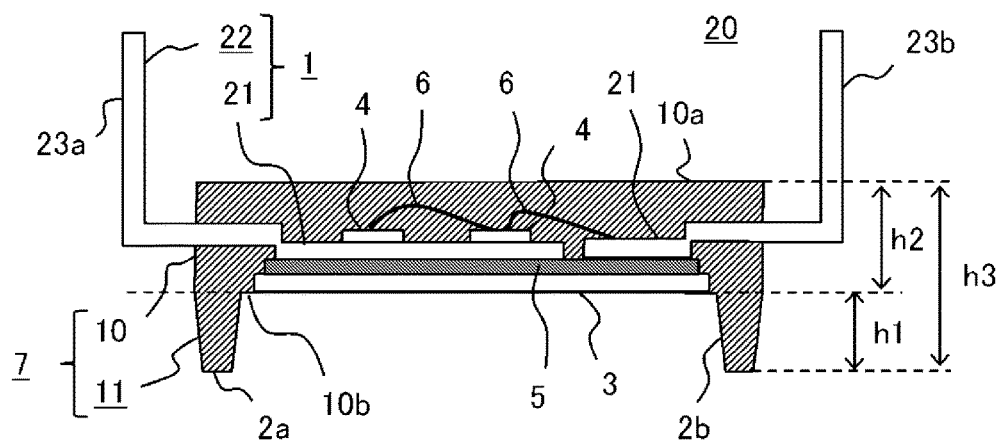
FIG. 1 is a cross-sectional view of a power module according to Embodiment 1 of the invention.
Figure 2:
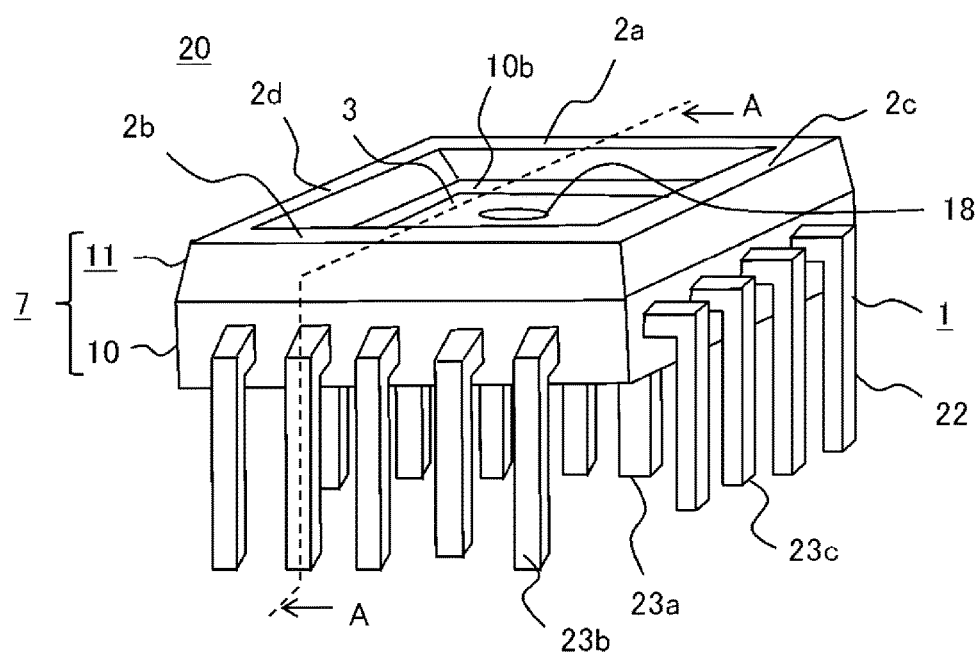
FIG. 2 is a perspective view of the power module of FIG. 1, viewed from a side where a metal base is seen.
Figure 3:
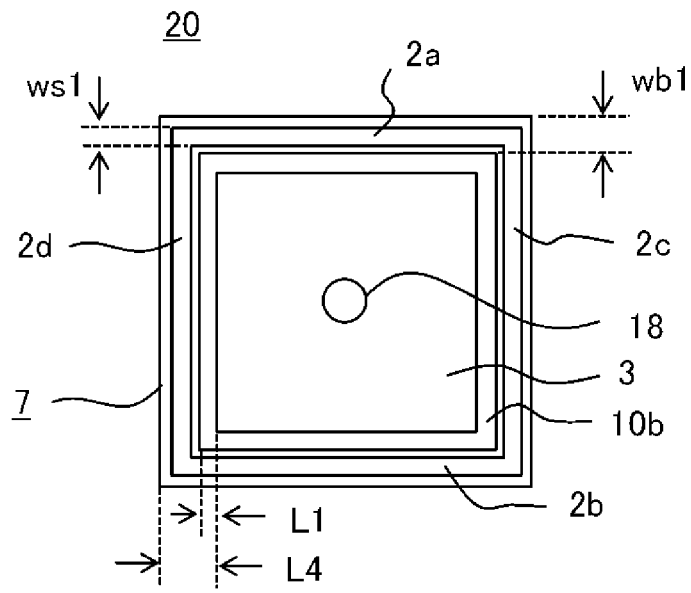
FIG. 3 is a bottom view of the power module of FIG. 1, viewed from a side where the metal base is placed.
Figure 4:
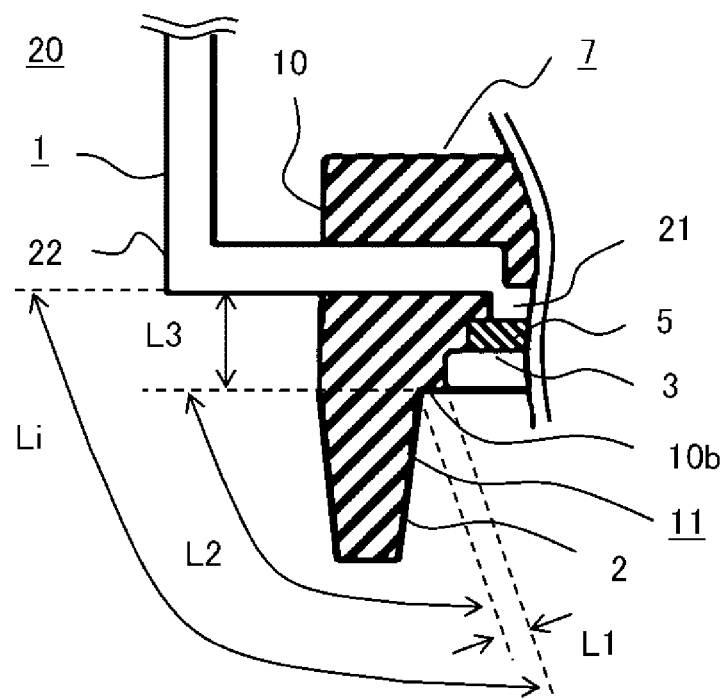
FIG. 4 is an enlarged view of a rib portion in the power module of FIG. 1.
Figure 5:
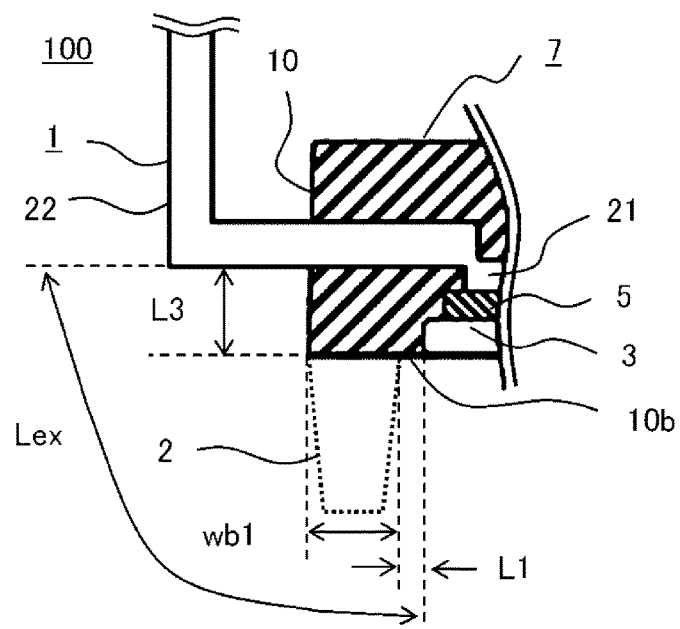
FIG. 5 is a diagram for illustrating an insulation distance of a power module of a comparative example.

FIG. 1 is a cross-sectional view of a power module according to Embodiment 1 of the invention. FIG. 2 is a perspective view of the power module of FIG. 1, viewed from a side where a metal base is seen, and FIG. 3 is a bottom view of the power module of FIG. 1, viewed from a side where the metal base is placed. FIG. 4 is an enlarged view of a rib portion in the power module of FIG. 1. FIG. 5 is a diagram for illustrating an insulation distance of a power module of a comparative example, which is an enlarged view of a region corresponding to FIG. 4. FIG. 1 is a cross-sectional view of a cut face indicated by a broken line in FIG. 2, viewed from A-direction, which has a vertically inverted relationship with FIG. 2. Note that in FIG. 3, a terminal portion 22 of a lead frame 1 is omitted from illustration. A power module 20 includes the lead frame 1, a metal base 3, power elements 4, an insulating sheet 5 and a resin enclosure 7. Examples of the power module 4 include: a diode to be used in a converter unit for converting input AC power into DC power; and a bipolar transistor, an IGBT (Insulated Gate Bipolar Transistor), a MOSFET (Metal Oxide Semiconductor Field Effect Transistor), a GTO (Gate Turn-Off Thyristor) and the like, that are to be used in an inverter unit for converting DC power into AC power.

The insulating sheet 5 is an insulating layer with a high heat-dissipation ability, which insulates a wiring portion 21 of the lead frame 1 from the metal base 3, and dissipates heat generated by the power elements 4 to the metal base 3. As the insulating sheet 5, an epoxy or like thermosetting resin is used, in which a highly conductive filler of silica, boron nitride (BN) or the like, is incorporated. The metal base 3 dissipates heat from the power elements 4. As the metal base 3, a highly thermo-conductive member, such as a copper plate, an aluminum plate, a copper foil or the like is used. The lead frame 1 is being formed into a pattern from a copper plate or an aluminum plate by press forming.

The lead frame 1 includes the wiring portion 21 and the terminal portion 22. On the wiring portion 21, the power elements 4 are mounted, and rear-surface electrodes of the power elements 4 are connected to that portion using a solder or the like. Further, the connections between the plural power elements 4 and the connections between the front-surface electrodes of the power elements 4 and the wiring portion 21 are established by wires 6. The lead frame 1 is electrically connected to these electrodes of the power elements 4. The terminal portion 22 has a plurality of terminals 23a, 23b, 23c to be connected to an external apparatus or the like. The respective terminals of the terminal portion 22 are bent into an L-shape and exposed from a body portion 10 of the resin enclosure 7. In FIG. 2, such an example is shown in which five terminals 23a, five terminals 23b and five terminals 23c are projecting in three directions around the power module 20. At a center portion of the power module 20, a hole 18 for fixing the power module 20 to a later-described heatsink 16 (see, FIG. 10) using a screw, is formed so as to penetrate the metal base 3 from an upper surface 10a of the resin enclosure 7. For the terminals, numeral 23 is used collectively, and numerals 23a, 23b, 23c, 23d (see, FIG. 8) are used when they are to be described distinctively.

The resin enclosure 7 is formed of an epoxy or like thermosetting resin, which is provided as a product through high-temperature molding and ensures the insulation between members placed in the resin enclosure 7. In the resin, a highly conductive filler of silica, alumina, boron nitride or the like is incorporated. Examples of how to get encapsulation by the resin include injection molding and transfer molding. For power modules, transfer molding is generally used. The resin enclosure 7 encapsulates the power elements 4 so that one surface of the metal base 3 (exposed surface) and a part (in the terminal portion 22) of the lead frame 1 are exposed from the enclosure. The resin enclosure 7 includes the body portion 10 and a rib portion 11. In the body portion 10, the power elements 4 and a part (in the terminal portion 22) of the lead frame 1 are placed, and at its bottom surface 10b, the one surface (exposed surface) of the metal base 3 is exposed. Exposing the metal base 3 makes it possible to reduce the surface area of the resin that has a hygroscopic property, so that an electric failure, such as ion migration or the like, due to moisture absorption is suppressed. The rib portion 11 is placed on the bottom surface 10b of the body portion 10 so as to surround the outer periphery of the metal base 3, and is formed to protrude from the bottom surface 10b of the body portion 10 in a direction perpendicular to the bottom surface 10b. The rib portion 11 includes four ribs 2a, 2b, 2c, 2d near the outer periphery of the bottom surface 10b of the body portion 10. For the ribs, numeral 2 is used collectively, and numerals 2a, 2b, 2c, 2d are used when they are to be described distinctively.

The ribs 2 are each placed on the bottom surface 10b of the resin enclosure 7 and outside the lateral surface of the metal base 3, and are formed to protrude, with respect to the bottom surface (exposed surface) of the metal base 3 as a reference plane, in a direction opposite to the direction in which the terminals 23 of the lead frame 1 are bent. Further, the cross-section of the rib 2 shown in FIG. 1 is a transverse cross-section in a direction perpendicular to its extending direction that is a direction parallel to the lateral surface of the body portion 10. The transverse cross-sections of the ribs 2 have each a taper shape that narrows toward the end thereof, so that mold releasability of a mold used for molding the resin enclosure 7 is improved. Furthermore, the ribs 2 are placed with the same height so as to surround (so as to enclose) the bottom surface (exposed surface) of the metal base 3, in which the adjacent ribs are being joined to each other. In the rib portion 11, since the adjacent ribs are joined to each other, its corner portions are improved in rigidity, so that bending rigidity of the power module 20 in directions toward the opposite corners (directions toward the three opposite corners) is improved. Note that it is desired that an R-shape or a taper shape be applied to the corner of the rib 2 in order to improve the mold releasability of the mold used at the time of molding the resin enclosure 7.

Figure 15:
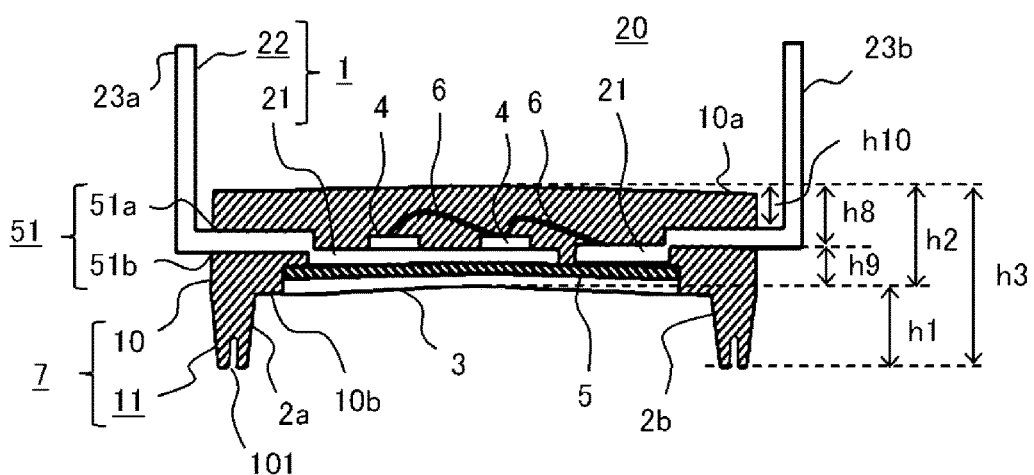
FIG. 15 is a cross-sectional view of another power module according to Embodiment 1 of the invention.
Figure 16:
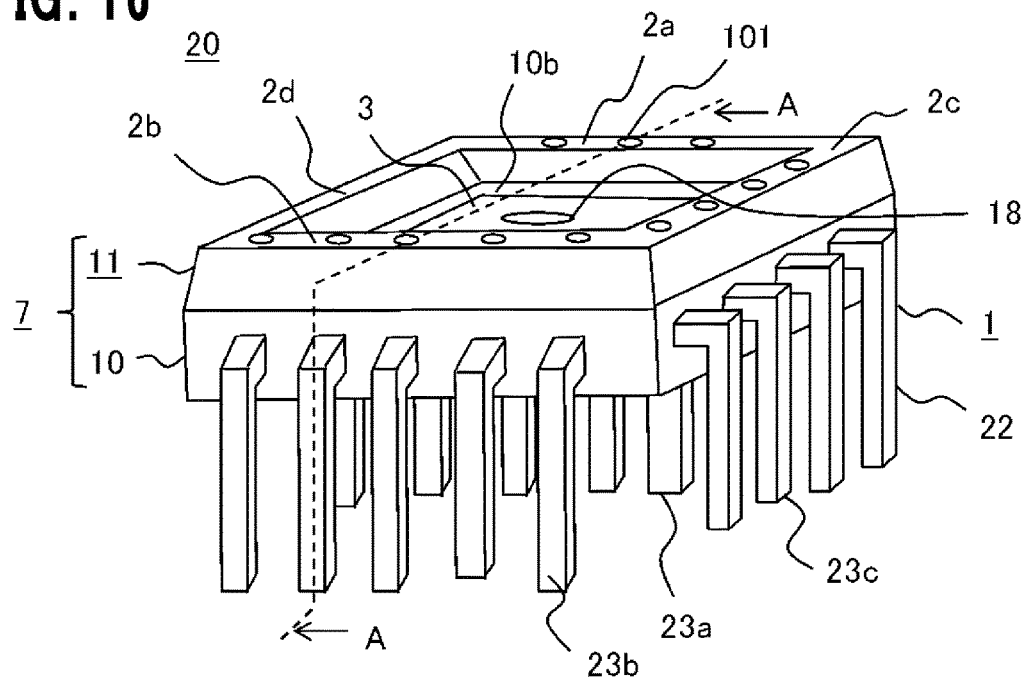
FIG. 16 is a perspective view of the power module of FIG. 15, viewed from a side where a metal base is seen.

Another power module shown in FIG. 15 and FIG. 16 is presented as an example in which the rib 2 has a depression 101 with a circular shape on the top thereof. FIG. 15 is a cross-sectional view of the other power module according to Embodiment 1 of the invention, and FIG. 16 is a perspective view of the power module of FIG. 15, viewed from a side where the metal base is seen. The depression 101 is positioned between the terminal 23 of the lead frame 1 and the metal base 3, to thereby increase the insulation distance between the terminal 23 of the lead frame 1 and the metal base 3. Accordingly, it is possible to make the width of the rib smaller by increasing the insulation distance by a degree corresponding to the depression. This makes it possible to make the module area much smaller. Here, the depression 101 is exemplified by that having a circular shape; however, it may have a polygonal shape, such as a triangular shape, a quadrangular shape, a pentagonal shape, a hexagonal shape, an octagonal shape, or the like.

The power elements 4 are mounted on the wiring portion 21 of the lead frame 1. The insulating sheet 5 and the metal base 3 are placed on a surface of the lead frame 1 opposite to its surface on which the power elements 4 are mounted. The power elements 4, the lead frame 1, the wires 6, the insulating sheet 5 and the metal base 3 are covered by the resin enclosure 7 in a state where the terminal portion 22 of the lead frame 1 and the bottom surface of the metal base 3 are exposed. The heat generated by the power elements 4 is dissipated to the lead frame 1, the insulating sheet 5 and the metal base 3.

According to the power module 20 of Embodiment 1, at the time the resin enclosure 7 is formed, the lead frame 1 is placed on a copper foil which is provided as the metal base 3 and on which a semi-cured insulating sheet 5 is applied. At this time, positioning of the copper foil relative to the mold for forming the resin enclosure 7 is executed in such a manner that movable pins are one by one placed in a longitudinal direction and a lateral direction near a corner portion of the copper foil, and a set of these movable pins is provided for each of the four corners of the copper foil. This restrains displacement of the foil from occurring due to the resin pressure when the resin is injected. If the copper foil is thin, it is easily warped thus making it difficult to be transported in equipment, whereas, if it is thick, the cost increases. Thus, the thickness of the copper foil is desired to be from 0.03 mm to 0.1 mm. The base plate 3, which is the copper foil exposed from the bottom surface 10b of the resin enclosure 7 in the power module 20, is coplanar with the bottom surface 10b of the resin enclosure 7. In the forming step of the resin enclosure 7, resin curing for the resin enclosure 7 is performed using a resin charging pressure and a resin temperature in the mold, and at the same time, the insulating sheet 5 is cured from its semi-cured state while being pressed against the copper foil (metal base 3) by way of the lead frame 1. This ensures high heat-dissipation and electrical insulation abilities of the insulating sheet 5. Further, when the thickness of the copper foil is from 0.03 mm to 0.1 mm, the power module is likely to be warped and deformed, so that the power module 20 gets a convex shape as shown in FIG. 15. Further, the power module 20 of Embodiment 1 does not absorb moisture through the copper-foil surface of the module, so that an electric failure, such as ion migration or the like, due to moisture absorption is suppressed.

Figure 17:
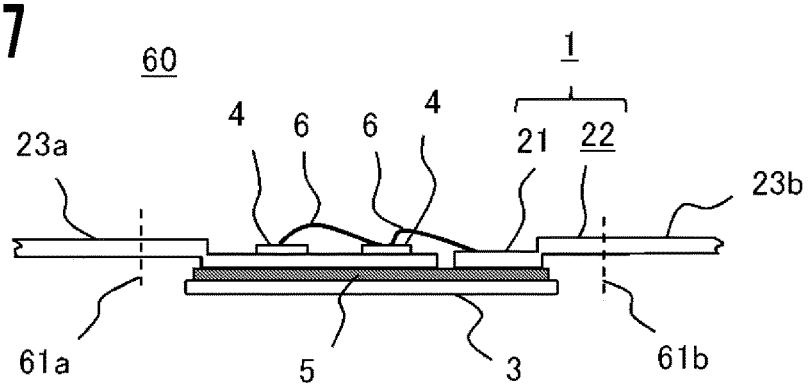
FIG. 17 is a diagram showing an intermediate-product assembly according to Embodiment 1 of the invention.
Figure 18:
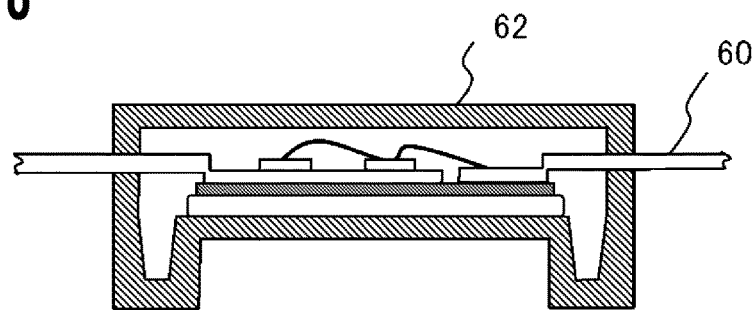
FIG. 18 is a diagram for illustrating a power module manufacturing method according to Embodiment 1 of the invention.
Figure 19:
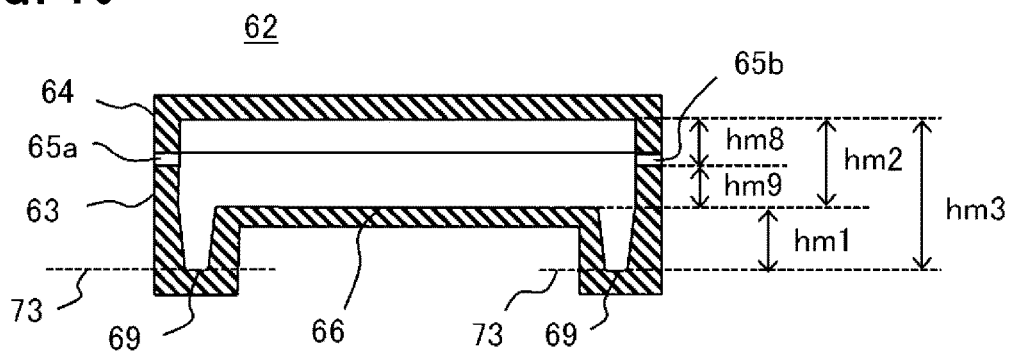
FIG. 19 is a cross-sectional view of a mold according to Embodiment 1 of the invention.

When focusing on the resin charging for the power module 20, in the forming step of the resin enclosure 7 of the power module 20, a region upper than the lead frame 1 where the resin thickness will be large is initially charged with the resin having high viscosity (stickiness), and a region for the ribs 2 in which flow resistance is high is charged lastly. Specifically, an intermediate-product assembly 60 in which the insulating sheet 5 and the metal base 3 are placed on the lead frame 1 on which the power elements 4 are mounted, is placed in a mold 62 so that the rib portion 11 is directed downward as shown in FIG. 1 (see, FIG. 18), and then the resin is injected through a face corresponding to the resin of the lead frame 1 (lateral side of the body portion 10). At this time, with respect to the order of placement in the mold 62, the insulating sheet 5 and the metal base 3 are firstly placed, and then the lead frame 1 on which the power elements 4 are mounted is placed. Accordingly, positioning accuracy of the respective members is improved in such a manner that positioning of the lead frame 1 is performed independently after performing positioning of the metal base 3. FIG. 17 is a diagram showing the intermediate-product assembly according to Embodiment 1 of the invention. FIG. 18 is a diagram for illustrating a power module manufacturing method according to Embodiment 1 of the invention, and FIG. 19 is a cross-sectional view of the mold according to Embodiment 1 of the invention. The mold 62 includes: a mold body 63 in which terminal openings 65a, 65b, through which the terminal portion 22 of the lead frame 1 is to be exposed to the outside, are formed; and a mold lid 64. Apart in the mold body 63 that is lower than a broken line 73 is a rib-end forming part 69 for forming each end of the ribs 2 of the rib portion 11 in the power module 20.

A rib height hm1, a body-portion height hm2, a resin-enclosure height hm3, a body-portion upper-side height hm8 and a body-portion rib-side height hm9, that are shown in FIG. 19, are heights that correspond, respectively, to a rib height h1, a body-portion height h2, a resin-enclosure height h3, a resin thickness h8 and a resin thickness h9 in the power module 20 shown in FIG. 15, and these heights are set to sizes in consideration of contraction of the resin enclosure 7 due to curing. At the time of placing the intermediate-product assembly 60 in the mold 62, the intermediate-product assembly 60 is placed in the mold 62 so that the metal base 3 is made contact with a metal-base placement part 66 and a part of the lead frame 1 is exposed from the mold 62. A part shown in FIG. 17 on the left side of a broken line 61a and a part shown therein on the right side of a broken line 61b are each the part to be exposed from the resin enclosure 7. When the intermediate-product assembly 60 is placed in the mold 62 so that the metal base 3 is made contact with the metal-base placement part 66, it is possible to manufacture the power module 20 in which the one surface of the metal base 3 is exposed. Note that the terminal portion 22 exposed from the resin enclosure 7 is bent into an L-shape after the resin-enclosure forming step of forming the resin enclosure 7, so that the plurality of terminals 23a, 23b are formed to be oriented in a direction given for the finished product (power module as the product).

Figure 20:
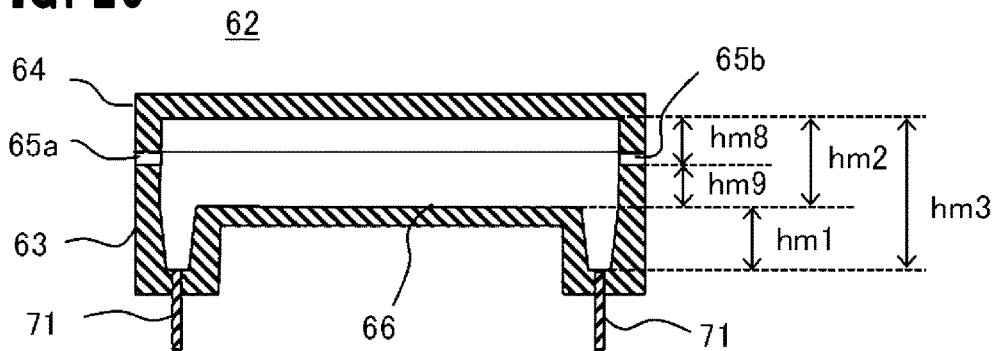
FIG. 20 is a cross-sectional view of another mold according to Embodiment 1 of the invention.
Figure 21:
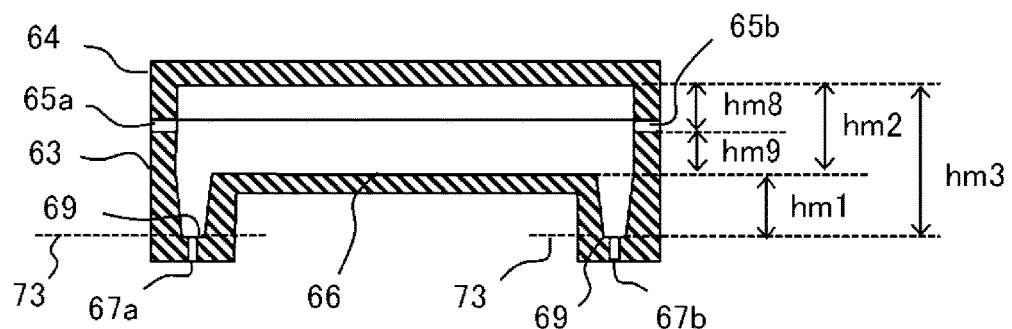
FIG. 21 is a cross-sectional view of a mold body and a mold lid in FIG. 20.

FIG. 20 is a cross-sectional view of another mold according to Embodiment 1 of the invention, and FIG. 21 is a cross-sectional view of a mold body and a mold lid in FIG. 20. In the forming step of the resin enclosure 7 in the power module 20 shown in FIG. 15, the mold 62 shown in FIG. 20 is used. The mold 62 shown in FIG. 20 includes: the mold body 63 that has the terminal openings 65a, 65b and pin openings 67a, 67b; the mold lid 64; and ejector pins 71 for improving mold releasability that are movably inserted in the pin openings 67a, 67b. The ejector pins 71 are operated by means of spring (not shown). In a state where the mold 62 is shut, namely, it is closed, the ejector pins 71 are not operated, and at the same time as the mold 62 is made open, the elector pins 71 are operated by means of spring. The pin opening 67a is a through-hole in which the pin is inserted at the time of pushing out the rib 2a of the power module 20 in FIG. 15. Likewise, the pin opening 67b is a through-hole in which the pin is inserted at the time of pushing out the rib 2b of the power module 20 in FIG. 15. At the time of executing the resin-enclosure forming step that is a step of forming the resin enclosure 7, by using the mold 62 shown in FIG. 20, the pin openings 67a, 67b are closed with the pins 71. The resin-enclosure forming step is executed in a state where the pin openings 67a, 67b are closed, and then, after the resin for forming the resin enclosure 7 (transfer-mold resin) is cured and at the same time as the mold 62 is made open, the ejector pins 71 go out from the pin openings 67a, 67b to the resin enclosure 7-side, to thereby push out the rib portion 11 of the resin enclosure 7, so that the resin enclosure 7 is ejected from the mold 62 (resin-enclosure ejecting step). At the time of ejecting the resin enclosure 7 from the mold 62, the depressions 101 are formed in the rib portion 11. Accordingly, the resin-enclosure ejecting step is also a step of forming the depressions 101 in the rib portion 11 (rib-portion's depression forming step). The depth of the depression 101 in the rib portion 11 is set larger than a width ws1 of the underside of the rib portion 11 (see, FIG. 3), namely, of a farthest end in the rib 2 overhanging from the body portion 10, so that the resin is prevented from intruding into and adhering to the mold, and thus cleaning of the mold 62 is made easier.

Note that it is allowed to apply an engraving to the mold for forming the resin enclosure 7 and then to place the copper foil on the engraving. By using the engraving, positioning of the metal base 3 as the copper foil relative to the mold for forming the resin enclosure 7 may be performed. In this case, the surface of the copper foil results in bulging from the bottom surface 10b of the resin enclosure 7 in the power module 20; however, this geometry does not matter.

On the other hand, in a conventional power module, only a body portion is provided, so that, in a resin-enclosure forming step of forming its resin enclosure, there is concern about the following problems. In the resin-enclosure forming step, when the power elements 4 mounted on the lead frame 1 are placed in the mold so that they are directed upward, since the resin is injected from the lateral surface-side of the body portion, there is concern that, air is left on a side where the power-element mounting surface of the lead frame 1 is placed, or at a lateral side of that surface, to form a void. In particular, when the wire 6 exists around the void, there is concern about a problem that the resin enclosure 7 covering the wire 6 becomes thin, or a problem that the wire 6 is exposed outside the resin enclosure 7. If such a state is established, there is concern that the spatial insulation distance between the wire 6 and a component placed outside the power module decreases, making it unable to ensure the insulation therebetween.

According to the power module 20 of Embodiment 1, in the resin-enclosure forming step, since the ribs 2 in the power module 20 are the last target in resin charging, there is no case where air is left on the side where the power-element mounting surface of the lead frame 1 is placed, or at the lateral side of that surface, to form a void. As a result, it becomes possible to ensure the spatial insulation distance from a component placed outside the power module 20 without occurrence of wire exposure or the like.

Further, in the power module 20 of Embodiment 1, the rib height h1 that is the height of each of the ribs 2a, 2b, 2c, 2d in the rib portion 11, is set smaller than the body-portion height h2 that is the height of the body portion 10 encapsulating the lead frame 1. Namely, there is provided a relationship of $h1<h2$. Since the resin-enclosure height h3 is equal to the sum of the rib height h1 and the body-portion height h2, a relationship of $h1<0.5 \times h3$ is also established.

In manufacturing the power module 20, it is required to match the curing time of the resin for the rein enclosure 7 equally to the time for curing the insulating sheet 5. When the curing time of the resin for the resin enclosure 7 becomes longer, the insulating sheet is cured earlier, so that adherence between the lead frame 1 and the insulating sheet 5 becomes poor, making it unable to ensure the heat-dissipation ability and the insulation ability. For that reason, in the power module 20, the rib height h1 is set smaller than the body-portion height h2 to thereby reduce an amount of charged resin for the rib portion 11, and thus to shorten the resin charging time for the rib portion 11. In the rib structure of the rib portion 11, the cross-sections of the ribs 2 have each a taper shape as described previously, namely, in order to enhance resin charging ability, a taper is formed in the rib 2. A width (connection width) of a connection region where the rib 2 of the rib portion 11 and the body portion 10 are connected to each other is a rib-base width wb1, and a width of an end of the rib 2 that is overhanging and farthest from the body portion 10 is an end width ws1. Since the taper is formed in the rib 2 of the rib portion 11, the end width ws1 is smaller than the rib-base width wb1, namely, a relationship of $ws1<wb1$ is established.

In the mold 62, a groove for forming the rib portion 11 of the power module 20 is narrow, so that there is concern in some cases that, when the power module 20 is ejected from the mold 62, the resin is left in the mold 62, namely, the rib portion gets out of shape. In the case where there is concern that the rib portion gets out of shape, the mold releasability may be improved in such a manner that the resin enclosure 7 is formed using the mold 62 shown in FIG. 20 and then the power module 20 is pressed out from the mold by pressing using the pins from the rib-side. At this time, the depressions 101 are formed on the ribs 2 in the power module 20. By keeping the depressions 101, it is possible to increase the insulation distances between the terminals 23 of the lead frame 1 and the metal base 3. In view of the mold releasability, it is preferable that the cross-section of the pin have a circular shape. Accordingly, it is preferable that the shape of the depression 101 be a circular shape, because it is matched both to the manufacturing method and to the viewpoint of ensuring the insulation distance.

According to the power module 20 of Embodiment 1, it is possible to cause the insulating sheet 5 to be cured within the resin charging time for the resin enclosure 7, to thereby ensure the heat-dissipation ability and the insulation ability of the insulating sheet 5.

According to the power module 20 of Embodiment 1, the rib 2 of the rib portion 11 can lengthen a lower peripheral-part length Li that is a creepage distance between the lead frame 1 and the metal base 3. The lower peripheral-part length Li as the creepage distance between the lead frame 1 and the metal base 3 corresponds to the insulation distance (creepage distance) between the lead frame 1 and the metal base 3. Thus, according to the power module 20 of Embodiment 1, it is possible to lengthen the insulation distance (creepage distance) between the lead frame 1 and the metal base 3. Using FIG. 4 and FIG. 5, the lower peripheral-part length Li of the power module 20 of Embodiment 1 will be described. Note that, in a power module 100 of FIG. 5 as a comparative example, the rib 2 of the power module 20 of Embodiment 1 is indicated as a broken line.

The lower peripheral-part length Li as the creepage distance between the lead frame 1 and the metal base 3 in the power module 20 of Embodiment 1 is equal to the sum of: a resin bottom-surface length L1 that is a length from the periphery of the metal base 3 to the rib 2 of the rib portion 11; an outer-circumference length L2 that is a length of the outer circumference of the rib 2; and a body bottom-part length L3 that is a length in the body portion 10 from its boundary with the rib portion 11 to the terminal portion 22 of the lead frame 1. With respect to the power module (comparative example) without having the rib 2, an insulation distance (creepage distance) Lex between the lead frame 1 and the metal base 3, will be described using the lengths and the widths described for the power module 20 of Embodiment 1. In the power module 100 of the comparative example, the insulation distance (creepage distance) Lex between the lead frame 1 and the metal base 3, is equal to the sum of the resin bottom-surface length L1, the rib-base width wb1 and the body bottom-part length L3. Since the rib-base width wb1 of the rib 2 is shorter than the outer-circumference length L2 of the rib 2, the insulation distance (lower peripheral-part length Li) of the power module 20 of Embodiment 1 can be longer than the insulation distance Lex of the power module of the comparative example. Further, according to the power module 20 of Embodiment 1, the higher the rib height h1 of the rib 2 becomes, the longer the outer-circumference length L2 as the length of the outer circumference of the rib 2 can be made.

Let's assume the case where the lower peripheral-part length Li of the power module 20 of Embodiment 1 is set equal to the insulation distance Lex of the power module 100 of the comparative example. In this case, according to the power module 20 of Embodiment 1, it is possible to make an end-to-end length L4 (see, FIG. 3) between the lateral surface (end) of the body portion 10 in the resin enclosure 7 from which the lead frame 1 is exposed, and the periphery (end) of metal base 3, shorter than that of the power module 100 of the comparative example. The end-to-end length L4 is equal to the sum of the resin bottom-surface length L1 and the rib-base width wb1 of the rib 2. Accordingly, the power module 20 of Embodiment 1 can be made smaller in the area of the power module than the power module 100 of the comparative example with the same insulation length, and thus can be downsized.

Further, the rib height h1 of the power module 20 is larger than the rib-base width wb1, and when the insulation distance is extended in the rib-height direction, it is possible to make the area of the power module 20 much smaller. Further, when, as shown in FIG. 15, a resin thickness h10 in the power module 20, that is a thickness determined by subtracting the thickness of the lead frame 1 from a resin thickness h8 above a lower-side surface placed in the lead frame 1 and projecting from the resin enclosure 7, is larger than a resin thickness h9 below the lower-side surface of the lead frame 1, the resin under the lower-side surface is likely to cause thermal contraction. This becomes significant in particular when the resin enclosure 7 is less linearly expansive than the lead frame 1. The resin thickness h10 is a maximum thickness between: a frame-contacting-region upper side 51a that is placed in a frame-contacting region 51 at which the lead frame 1 is projecting from the resin enclosure 7 and on a side toward the upper surface 10a; and the upper surface 10a. The resin thickness h9 is a minimum thickness between: a frame-contacting-region bottom side 51b that is placed in the frame-contacting region 51 and on its side toward the bottom surface 10b; and the exposed surface of the metal base 3. The shape of the frame-contacting region 51 is the same as the cross-section of the lead frame 1 projecting from the resin enclosure 7. Further, inclusion of the ribs 2 at the end portions of the power module 20 makes the resin amount larger, so that, when a portion placed under the lower-side surface causes thermal contraction, the power module 20 is likely to warp into an upwardly convex shape with respect to the exposed surface of the metal base 3 as a vertical reference. It is possible to achieve making the resin thickness h10, that is the thickness determined by subtracting the thickness of the lead frame 1 from the resin thickness h8, larger than the resin thickness h9, by executing the resin-enclosure forming step using the mold 62 in which the body-portion upper-side height hm8 is larger than the body-portion rib-side height hm9.

Furthermore, in the power module 20 of Embodiment 1, the rib 2 also serves as a joist, so that the bending rigidity of the power module is improved. According to the power module 20 of Embodiment 1, because the bending rigidity of the power module is improved, it is possible to reduce: the thermal contraction of the resin that occurs when the power module with the resin enclosure 7 molded at a high temperature is cooled to an ambient temperature; and the warpage amount of the power module due to a liner expansion difference that emerges during that cooling step between the members of the lead frame 1, the metal base 3, the resin enclosure 7 and the like. As a result, according to the power module 20 of Embodiment 1, it is not required to use the retaining member as in Patent Document 1, so that the step for fixing the power module to the heatsink can be shortened in comparison with the power module of Patent Document 1. Further, according to the power module 20 of Embodiment 1, because the retaining member as in Patent Document 1 is not required for use, the cost for that retaining member does not arise, thus making it possible to achieve cost reduction.

The power module 20 of Embodiment 1 includes the rib portion 11 which is placed on the bottom surface 10b of the body portion 10 in the resin enclosure 7 so as to surround the outer periphery of the metal base 3, and is formed to protrude from the bottom surface 10b of the body portion 10 in a direction perpendicular to the bottom surface 10b, namely, it includes the ribs 2 which are each placed on the bottom surface 10b of the resin enclosure 7 and outside the lateral surface of the metal base 3, and are formed to protrude from the bottom surface 10b. Thus, it can be downsized while enhancing the insulation between the lead frame 1 and the metal base 3. Further, in the power module 20 of Embodiment 1, the insulating sheet 5 is placed inside the bottom surface 10b of the body portion 10, so that the insulating sheet 5 that is expensive is minimized in size.

It is noted that, in FIG. 1, such an example is shown in which, in the lead frame 1, a step is formed inside an end surface in contact with the insulating sheet 5, to thereby allocate the wiring portion 21. Because of the step between the wiring portion 21 and the terminal portion 22, the terminal portion 22 is provided with a height from the metal base 3 that is higher than that of the wiring portion 21, so that the insulation distance between the lead frame 1 and the metal base 3 is made longer to the extent of a thickness of the resin enclosure 7 corresponding to that step. In this Embodiment, the step is formed so that its level is equal to or less than half the thickness of the lead frame 1, for example, it is 0.3 mm relative to the thickness of the lead frame 1 of 0.6 mm. This is because, when the step of the lead frame 1 is created by step-forming processing, such as a pressing process or the like, there is concern about breaking or the like if the step level of the lead frame 1 is large, and thus it is required that the step be provided as an unbreakable one. As the thickness of the lead frame 1 increases, the warpage amount of the power module 20 due to linear expansion difference between the lead-frame member and the resin increases, so that the thickness of the lead frame 1 is desired to fall in a range of 0.3 to 1.0 mm.

According to the power module 20 of Embodiment 1, applying the step-forming processing to the lead frame 1 makes it possible for the lead frame 1 to be encapsulated by the resin in a thin state, so that the module thickness can be reduced and uniformed. In the case of reducing the module thickness, the module thickness of the power module 20, namely, the body-portion height h2 is desired to fall in a range of 5 mm to 15 mm. Further, when the warpage amount in the convex shape of the power module 20 exceeds 0.1 mm, it becomes difficult to make the power module 20 flat using a screw-fastening force, so that the warpage amount is desired to be 0.1 mm or less. Meanwhile, according to the power module 20 of Embodiment 1, the rib height h1 is set larger than the rib-base width wb1, and this serves both to ensure the insulation ability of the module and to downsize it.

Figure 22:
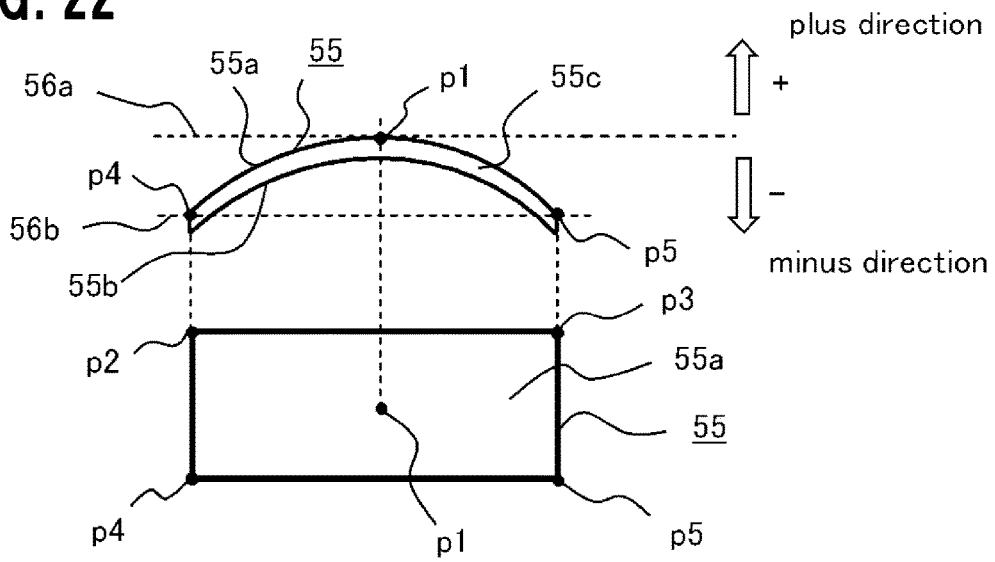
FIG. 22 is a diagram for illustrating a warpage amount of a power module.
Figure 23:
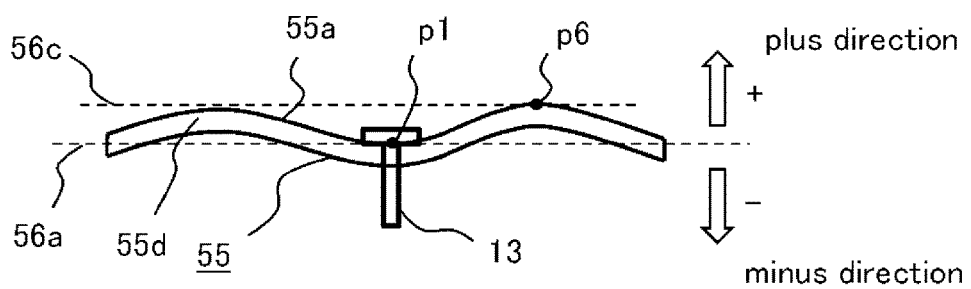
FIG. 23 is a diagram for illustrating a warpage amount in a plus direction of a power module.
Figure 24:
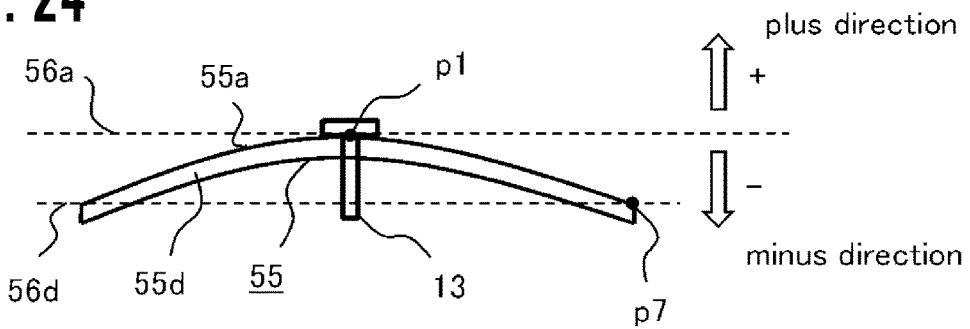
FIG. 24 is a diagram for illustrating a warpage amount in a minus direction of the power module.

Here, the warpage amount of a power module will be described. FIG. 22 is a diagram for illustrating the warpage amount of the power module. FIG. 23 is a diagram for illustrating the warpage amount in a plus direction of the power module, and FIG. 24 is a diagram for illustrating the warpage amount in a minus direction of the power module. In each of FIG. 22 to FIG. 24, a state of a power module 55 before fastened by a screw is shown.

The power module 55 in FIG. 22 to FIG. 24 is being simplified such that the rib portion 11, the metal base 3 and the like are omitted. On the upper side in FIG. 22, a power-module lateral surface 55c that is a lateral surface of the power module 55 is shown, and on the lower side, a power-module upper surface 55a that is the upper surface of the power module 55 is shown. On a power-module bottom surface 55b that is the bottom surface of the power module 55, the metal base 3 that is not shown is placed. The warpage amount of this power module is also applicable to the power module 20 of this application.

Symbols "+" ("plus") and "−" ("minus") indicative of the directions of the warpage amount of the power module 55 are each determined with respect to the exposed surface of the metal base (the power-module bottom surface 55b in FIG. 22) as a vertical reference, and it is assumed that "+" corresponds to a warpage with an upwardly protruding shape and "−" corresponds to a warpage with a downwardly protruding shape. However, the warpage amount is measured from the upper surface of the power module 55 (power-module upper surface 55a). Thus, in FIGS. 22 to 24, a broken line 56a on the power-module upper surface 55a is used as a reference for the actual measurement. Before the power module 55 is screw-fastened, as shown in FIG. 22, the amount is represented by a difference between: a measuring point p1 at the center on the resin-side of the power module 55, namely, in the power-module upper surface 55a; and an average point of measuring points p2, p3, p4 and p5 at the four corners. In FIG. 22, the measuring point p1 is at a highest upward position, and the measuring points p2, p3, p4, p5 at the four corners are at positions lower than the measuring point p1. A broken line 56b passes through the measuring point at which the absolute value of the warpage amount becomes maximum, and is parallel to the broken line 56a. Note that the broken line 56a used as the reference is set, for example, perpendicularly to the hole 18 through which a screw 13 for screw-fastening passes. Accordingly, in the power module 55 of FIG. 22, the warpage amount is "−", so that the warpage is provided with a downwardly protruding shape.

In each of FIG. 23 and FIG. 24, a state is shown where the module is screw-fastened using the screw 13, at the measuring point p1 placed at the center of the power-module upper surface 55a, to the heatsink 16 that is unshown here. In each of FIG. 23 and FIG. 24, a power-module cross-section 55d that is a cross-section of the power module 55 is shown. Note that diagonal lines indicative of a cross-section are omitted here. The warpage amount of the power module 55 in a state during screw-fastening is determined with reference to the center measuring point p1, namely, the broken line 56a, to be a difference between: a measuring point that is a point farthest heightwise from the center measuring point p1; and the measuring point p1. In the power module 55 of FIG. 23, the warpage amount is determined to be a difference between: a measuring point p6 that is a point farthest heightwise from the center measuring point p1; and the measuring point p1. A broken line 56c passes through the measuring point p6, and is parallel to the broken line 56a. In the power module 55 of FIG. 23, the warpage amount is "+", so that the warpage is provided with an upwardly protruding shape. In the power module 55 of FIG. 24, the warpage amount is determined to be a difference between: a measuring point p7 that is a point farthest heightwise from the center measuring point p1; and the measuring point p1. A broken line 56d passes through the measuring point p7, and is parallel to the broken line 56a. In the power module 55 of FIG. 24, the warpage amount is "−", so that the warpage is provided with a downwardly protruding shape. Note that the power module 55 of FIG. 24 shows an initial state during screw-fastening of the power module 55 of FIG. 22, and the power module 55 of FIG. 23 shows a final state during screw-fastening of the power module 55 of FIG. 22.

Meanwhile, in this Embodiment, a unit in which the individual insulating sheet 5 and metal base 3 are combined together is used; however, this is not limitative, and the rib structure of this Embodiment may be applied to a power module which includes a usual ceramic board or metal board. Further, the rib structure of this Embodiment may be applied to a module in which the insulating sheet 5 is not used and the power elements 4 are connected to the metal base 3 that is thick.

As described above, the power module 20 of Embodiment 1 comprises: the power elements 4; the metal base 3 for dissipating heat from the power elements 4; the lead frame 1 electrically connected to the electrodes of the power elements 4; and the resin enclosure 7 that encapsulates the power elements 4 so that one surface of the metal base 3 and a part of the lead frame 1 are exposed from the enclosure. The resin enclosure 7 of the power module 20 is characterized by comprising: the body portion 10 in which the power elements 4 and a part of the lead frame 1 are placed, and at the bottom surface 10b of which said one surface of the metal base 3 is exposed; and the rib portion 11 which is placed on the bottom surface 10b of the body portion 10 so as to surround the outer periphery of the metal base 3, and is formed to protrude from the bottom surface of the body portion 10 in a direction perpendicular to the bottom surface 10b. Because of inclusion of the rib portion 11 which is placed on the bottom surface 10b of the body portion 10 of the resin enclosure 7 so as to surround the outer periphery of the metal base 3, and is formed to protrude from the bottom surface 10b of the body portion 10 in a direction perpendicular to the bottom surface 10b, the power module 20 of Embodiment 1 can be downsized while enhancing the insulation between the lead frame 1 and the metal base 3. Furthermore, according to the power module 20 of Embodiment 1, due to the effect of the rib 2 as a joist, the rigidity of the power module 20 can be increased to thereby control the warpage amount effectively.

The power module manufacturing method of manufacturing the power module 20 of Embodiment 1 is characterized by comprising: a step of placing the intermediate-product assembly 60 which comprises the power elements 4, the metal base 3 and the lead frame 1, in the mold 62 so that the metal base 3 is in contact with the metal-base placement part 66 and a part of the lead frame 1 is exposed from the mold 62; and a step of forming the resin enclosure 7 by injecting a transfer-mold resin into the mold 62. According to the power module manufacturing method of Embodiment 1, it is possible to manufacture the power module 20 which includes the rib portion 11 which is placed on the bottom surface 10b of the body portion 10 of the resin enclosure 7 so as to surround the outer periphery of the metal base 3, and is formed to protrude from the bottom surface 10b of the body portion 10 in a direction perpendicular to the bottom surface 10b. Further, according to the power module manufacturing method of Embodiment 1, it is possible to manufacture the power module 20 having a shape upwardly convex with respect to the exposed one surface of the metal base 3 as a vertical reference, by using such a mold 62 in which, a length in a direction perpendicular to the bottom surface 10b of the resin enclosure 7 (body-portion rib-side height hm9), which is provided between the metal-base placement part 66 with which the metal base 3 is to be in contact, and an opening one-side that is placed on a side toward the metal base in an opening of the mold (terminal openings 65a, 65b) through which the lead frame 1 is to be exposed, is shorter than, a length in a direction perpendicular to the bottom surface 10b of the resin enclosure 7 (body-portion upper-side height hm8), which is provided between an inner surface of the mold at which the upper surface 10a of the power module 20 opposite to the bottom surface 10b is to be formed, and the opening one-side.

In another aspect, the power module manufacturing method of Embodiment 1 is characterized in that: such a mold 62 is used in which, in its rib-end forming part 69 at which the end of the rib portion 11 overhanging from the bottom surface 10b of the resin enclosure 7 is to be formed, the plurality of pin openings 67a, 67b in which pins for ejecting the resin enclosure 7 are to be inserted are formed; the step of forming the resin enclosure 7 is executed in a state in which the pin openings 67a, 67b are closed; and the power module manufacturing method further comprises a step of forming depressions 101 in the rib portion 11 in such a manner that, at the time the resin enclosure 7 is ejected from the mold 62, the pins are inserted beyond the pin openings 67a, 67b to push out the rib portion 11 of the resin enclosure 7. According to the power module manufacturing method of Embodiment 1, it is possible to manufacture the power module 20 provided with the rib portion 11 having the depressions 101 at its end overhanging from the bottom surface 10b, by using the mold 62 in which the plurality of pin openings 67a, 67b are formed.

Embodiment 2

Figure 6:
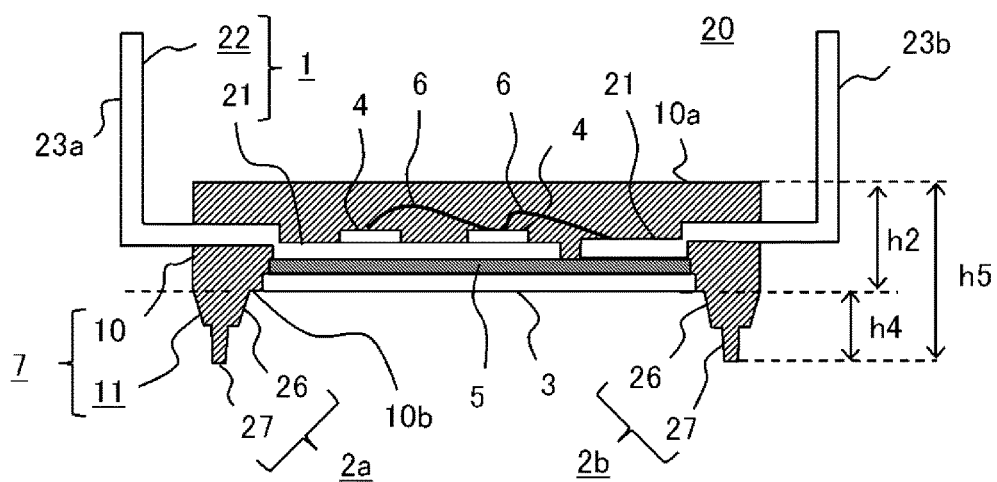
FIG. 6 is a cross-sectional view of a power module according to Embodiment 2 of the invention.

FIG. 6 is a cross-sectional view of a power module according to Embodiment 2 of the invention. A power module 20 of Embodiment 2 differs from that of Embodiment 1 in the shape of the rib 2 of the rib portion 11. The rib 2 includes a rib foundation part 26 and a protruding part 27. Like Embodiment 1, the power module 20 of Embodiment 2 includes the ribs 2 which are each placed on the bottom surface 10b of the resin enclosure 7 and outside the lateral surface of the metal base 3, and are formed to protrude from the bottom surface 10b, so that it can be downsized while enhancing the insulation between the lead frame 1 and the metal base 3. In FIG. 6, ribs 2a, 2b are illustrated. The protruding part 27 has a shape of a small rib placed on the rib foundation part 26. The rib foundation part 26 is connected to the bottom surface 10b of the body portion 10, and the protruding part 27 is placed on an end of the rib foundation part 26 overhanging from the bottom surface 10b of the body portion 10, and is formed to protrude in a direction perpendicular to the bottom surface 10b of the body portion 10. Since the small-rib shape of the protruding part 27 provides a narrow head, it is desirable to take a measure to prevent the head portion from chipping off, for example, to apply an R-shape to that portion.

Like FIG. 1, the cross-section of the rib 2 shown in FIG. 6 is a transverse cross-section perpendicular to its extending direction that is parallel to the lateral surface of the body portion 10. In the rib foundation part 26, its shape in a transverse cross-section that is a cross-section perpendicular to the bottom surface 10b of the body portion 10, is a taper shape in which a connection width with which the rib foundation part is connected to the bottom surface 10b of the body portion 10 is larger than a width of a rib-foundation-part end that is an end overhanging from the bottom surface 10b; and in the protruding part 27, its shape in a transverse cross-section that is a cross-section perpendicular to the bottom surface 10b of the body portion 10, is a taper shape in which a connection width with which the protruding part is connected to the rib foundation part 26 is larger than a width of a protruding-part end that is an end overhanging from the rib-foundation-part end.

The rib 2 in Embodiment 2 has a two-stage shape in which the taper inclination of the protruding part 27 is steeper than the taper inclination of the rib foundation part 26, so that the outer-circumference length L2 of the rib 2 is longer than that of a rib having a one-step shape as shown in Embodiment 1, even when these ribs have the same height. Thus, according to the power module 20 of Embodiment 2, it is possible to make the lower peripheral-part length Li between the lead frame 1 and the metal base 3 larger than in the case of a same-height rib 2 having a one-step shape, namely, it is possible to increase the insulation distance between the lead frame 1 and the metal base 3. Furthermore, according to the power module 20 of Embodiment 2, when the insulation distance required is to be established, it is possible to make a rib height h4 smaller than in the case of the power module 20 of Embodiment 1.

In the power module 20 of Embodiment 2, the height of the body portion 10 in the resin enclosure 7 is the body-portion height h2, the height of the rib portion 11 is the rib height h4, and the height of the resin enclosure 7 is a resin-enclosure height h5. Since the rib height h4 is smaller than the rib height h1 in Embodiment 1, the power module 20 of Embodiment 2 could reduce the height of the resin enclosure 7 while ensuring sufficiently the insulation distance between the lead frame 1 and the metal base 3, and thus the resin enclosure 7 could be more downsized than in the case of the power module 20 of Embodiment 1. Furthermore, according to the power module 20 of Embodiment 2, it is possible to decrease the resin amount of the ribs 2, to thereby reduce the resin cost of the resin enclosure 7.

Embodiment 3

Figure 7:
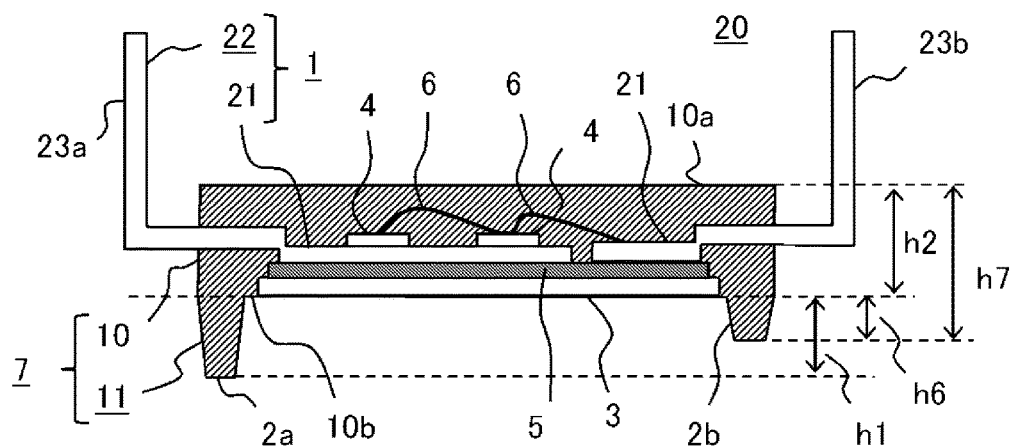
FIG. 7 is a cross-sectional view of a power module according to Embodiment 3 of the invention.

FIG. 7 is a cross-sectional view of a power module according to Embodiment 3 of the invention. A power module 20 of Embodiment 3 differs from that of Embodiment 1 in that the heights of the ribs 2 in the rib portion 11 are separated into two types of heights. In FIG. 7, such an example is shown in which the height of a rib 2a is a rib height h1 and the height of a rib 2b is a rib height h6.

The insulation distance between the lead frame l and the metal base 3 depends on a voltage required for each of the terminals 23. For example, at the terminal 23a that is an output terminal in the lead frame 1 on which a power element 4, such as, an IGBT, an FwD (Free Wheeling Diode), a CVD (Converter Diode) or the like, is mounted, a high voltage is given. In contrast, at the terminal 23b that is a control terminal in the lead frame 1 for controlling the gate of an IGBT, or a control terminal in the lead frame 1 for detecting a current for a current sensor, a low voltage is given. The ribs 2a and 2b shown in FIG. 7 can also be referred to as a high voltage-side rib and a low voltage-side rib, respectively.

Accordingly, it is allowable that the height of the rib 2a placed between the terminal 23a as an output terminal in the lead frame 1 at which a high voltage is given and the metal base 3, be set higher, while the height of the rib 2b placed between the terminal 23b as a control terminal in the lead frame 1 at which a low voltage is given and the metal base 3, be set lower. Namely, it is allowable that the height of the high voltage-side rib 2a be set higher, while the height of the low voltage-side rib 2b be set lower. In this Embodiment, like the power module 20 shown in FIG. 2, the terminals 23 of the lead frame 1 are projecting in the three directions, so that, with respect to the direction in which no terminal of the lead frame 1 is projecting, namely, with respect to the rib 2d, since it is associated with a low voltage, the lower voltage-side rib whose height is the rib height h6 is applied. With respect to the rib 2c, when the terminal 23c is a terminal at which a high voltage is given, the high voltage-side rib is applied, and when the terminal 23c is a terminal at which a low voltage is given, the low voltage-side rib is applied.

Like Embodiment 1, the power module 20 of Embodiment 3 includes the ribs 2 which are each placed on the bottom surface 10b of the resin enclosure 7 and outside the lateral surface of the metal base 3, and are formed to protrude from the bottom surface 10b, so that it can be downsized while enhancing the insulation between the lead frame 1 and the metal base 3. According to the power module 20 of Embodiment 3, in at least one rib (ribs 2b, 2d) among the plurality of ribs 2 of the rib portion 11, the rib height h6 that is a height from the bottom surface 10b of the body portion 10 to an end of that rib (ribs 2b, 2d) which is farthest from the bottom surface 10b of the body portion 10, is lower than the rib height h1 of the other rib (rib 2a). According to the power module 20 of Embodiment 3, since it includes the ribs 2 with different heights in conformity with the voltages at the terminals of the lead frame 1, it is possible to decrease the resin amount of the resin enclosure 7 while sustaining an effect of reducing the warpage of power module, to thereby reduce the resin cost of the resin enclosure 7. Note that the description has been made using an example in which the heights of the ribs 2 in the rib portion 11 are separated into two types of heights; however, they may be separated into three types of heights.

Embodiment 4

Figure 8:
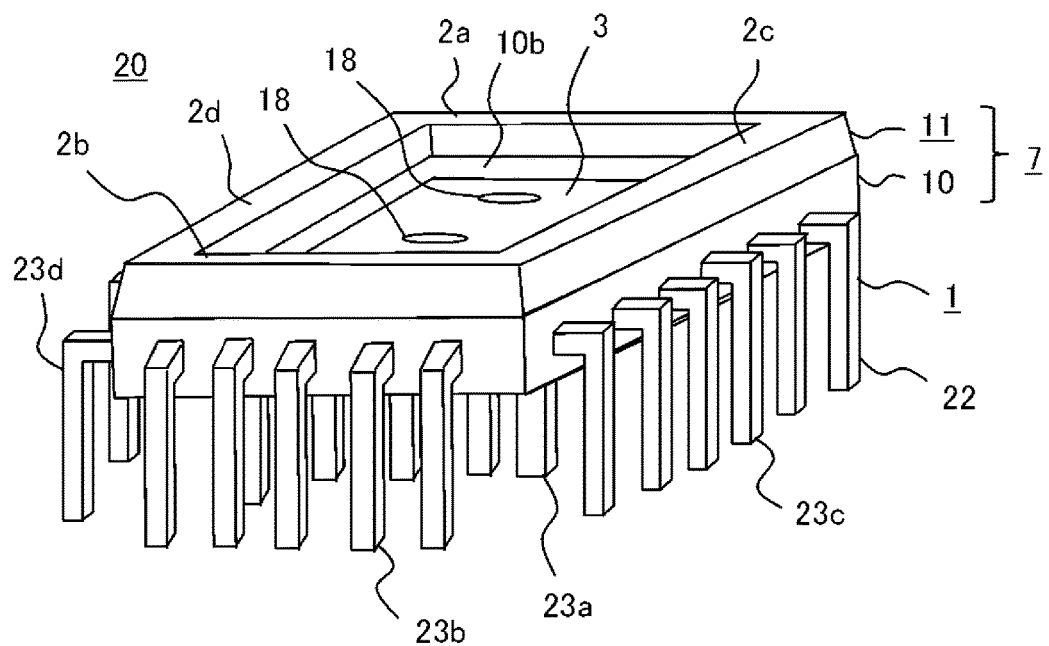
FIG. 8 is a perspective view of a power module according to Embodiment 4 of the invention.
Figure 9:
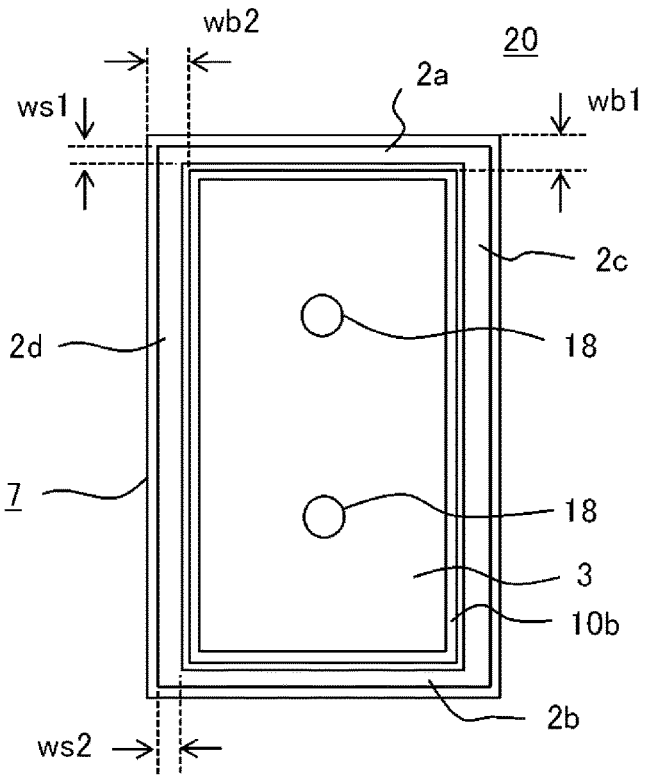
FIG. 9 is a bottom view of the power module of FIG. 8, viewed from a side where a metal base is placed.

FIG. 8 is a perspective view of a power module according to Embodiment 4 of the invention, and FIG. 9 is a bottom view of the power module of FIG. 8, viewed from a side where the metal base is placed. Note that in FIG. 9, the terminal portion 22 of the lead frame 1 is omitted from illustration. A power module 20 of Embodiment 4 differs from that of Embodiment 1 in that its outer shape viewed from the side of the upper surface 10a or the bottom surface 10b of the resin enclosure 7 is an oblong shape. Note that the outer shape viewed from the side of the upper surface 10a or the bottom surface 10b of the resin enclosure 7 is not limited to an oblong shape, and may be a quadrilateral shape having long sides and short sides. In external appearance, the power module 20 has a configuration in which the terminals 23 of the lead frame 1 are projecting out in the four directions, and holes 18 for fixing the power module 20 are formed at two spots. The ribs 2c, 2d, that are placed peripherally at the respective long sides and in the longitudinal direction of the power module 20, are larger in thickness than the ribs 2a, 2b that are place peripherally at the respective short sides and in the transverse direction. Further, in this Embodiment, the terminals 23 of the lead frame 1 are assumed to project in four directions from the lateral surfaces of the power module 20; however, the number of directions in which the terminals 23 are projecting is not limited thereto. In FIG. 8, such an example is shown in which, from the lateral surfaces of the resin enclosure 7 along which the respective ribs 2a, 2b are formed to be placed peripherally at the short sides, the respective sets of five terminals 23a, 23b are projecting; and from the lateral surfaces of the resin enclosure 7 along which the respective ribs 2c, 2d are formed to be placed peripherally at the long sides, the respective sets of six terminals 23c, 23d are projecting.

In general, the warpage amount of a power module in its longitudinal direction is larger than that in its transverse direction. Since the warpage of the power module is smaller in the transverse direction of the power module, according to the power module 20 of Embodiment 4 provided with the ribs 2, it is allowable to make the ribs 2a, 2b placed in the transverse direction smaller in thickness than the ribs 2c, 2d placed in the longitudinal direction. Note that, where appropriate, the rib placed in the transverse direction is referred to as a transverse-direction rib or a short-side rib, and the rib placed in the longitudinal direction is referred to as a longitudinal-direction rib or a long-side rib.

Like Embodiment 1, in the power module 20 of Embodiment 4, the cross-sections of the ribs 2 in the rib structure of the rib portion 11 each have a taper shape.

The width of a connection region where each of the transverse-direction ribs 2a, 2b of the rib portion 11 is connected to the body portion 10 is the rib-base width wb1, and the width of the end of each of the ribs 2a, 2b that is overhanging and farthest from the body portion 10 is the end width ws1. The width of a connection region where each of the longitudinal-direction ribs 2c, 2d of the rib portion 11 is connected to the body portion 10 is the rib-base width wb2, and the width of the end of each of the ribs 2c, 2d that is overhanging and farthest from the body portion 10 is the end width ws2. Since the taper is formed in each of the ribs 2a, 2b, 2c, 2d of the rib portion 11, the end widths ws1, ws2 are, respectively, smaller than the rib-base widths wb1, wb2, namely, relationships of ws1<wb1 and ws2<wb2 are established.

In the power module 20 of Embodiment 4, the transverse-direction ribs 2a, 2b are set smaller in thickness than the longitudinal-direction ribs 2c, 2d, namely, the rib-base width wb1 of the transverse-direction rib is smaller than the rib-base width wb2 of the longitudinal-direction rib, and the end width ws1 of the transverse-direction rib is smaller than the end width ws2 of the longitudinal-direction rib. Namely, relationships of wb1<wb2 and ws1<ws2 are established.

Like Embodiment 1, the power module 20 of Embodiment 4 includes the ribs 2 which are each placed on the bottom surface 10b of the resin enclosure 7 and outside the lateral surface of the metal base 3, and are formed to protrude from the bottom surface 10b, so that it can be downsized while enhancing the insulation between the lead frame 1 and the metal base 3. According to the power module 20 of Embodiment 4, since the transverse-direction ribs 2a, 2b are smaller in thickness than the longitudinal-direction ribs 2c, 2d, it is possible to decrease the resin amount of the resin enclosure 7 while sustaining an effect of reducing the warpage of power module, to thereby reduce the resin cost of the resin enclosure 7.

Embodiment 5

Figure 10:
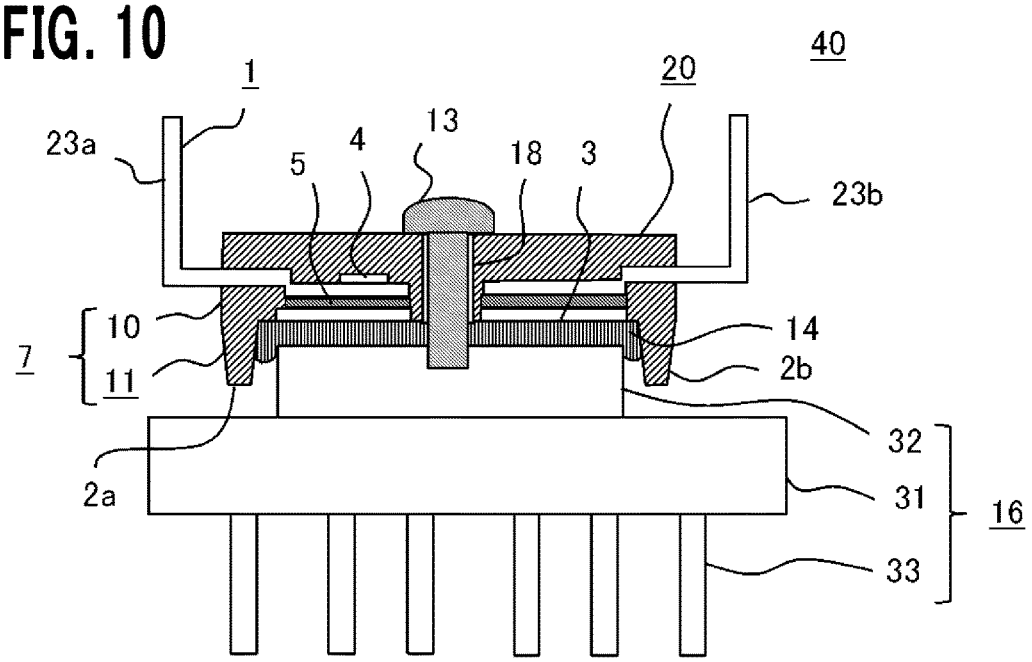
FIG. 10 is a cross-sectional view of a power semiconductor device according to Embodiment 5 of the invention.
Figure 11:
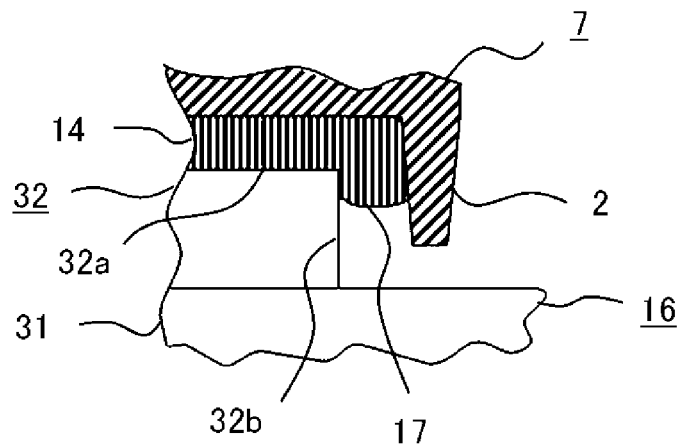
FIG. 11 is a diagram showing a main part of the power semiconductor device of FIG. 10.
Figure 12:
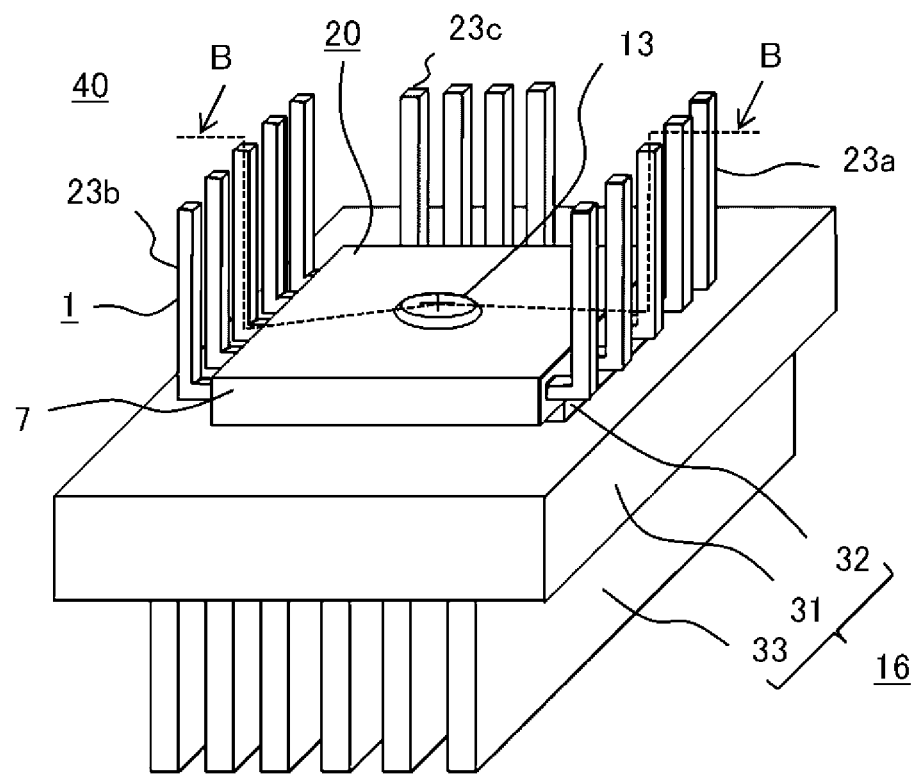
FIG. 12 is a perspective view of the power semiconductor device of FIG. 10.

FIG. 10 is a cross-sectional view of a power semiconductor device according to Embodiment 5 of the invention. FIG. 11 is a diagram showing a main part of the power semiconductor device of FIG. 10, and FIG. 12 is a perspective view of the power semiconductor device of FIG. 10. FIG. 10 is a cross-sectional view of a cut face indicated by a broken line in FIG. 12, viewed from B-direction. In Embodiment 5, an example will be described which is a power semiconductor device 40 that includes a power module 20 and a heatsink 16. Description will be made about a case where the configuration of the power module 20 is the same as in Embodiment 1. The heatsink 16 includes a heatsink foundation part 31, an on-base stepped part 32, and fins 33. A grease 14 is applied onto a flat upper surface 32a of the on-base stepped part 32 provided in the heatsink 16, so that the bottom surface of the metal base 3 in the power module 20 is coupled using a screw 13 to the heatsink 16 through the grease 14. The heat generated by the power elements 4 in the power module 20 is transferred from the metal base 3 through the grease 14 to the on-base stepped part 32 in the heatsink 16, and is then dissipated to the heatsink foundation part 31 and the fins 33 in the heatsink 16.

The flat upper surface 32a of the on-base stepped part 32 is broader than the flat bottom surface of the metal base 3. The purpose of this is to make a heat-dissipation area larger at the on-base stepped part 32 than the heat-dissipation area of the metal base 3 from which the heat generated by the power modules 4 is dissipated, to thereby improve the heat-dissipation ability for the heat generated by the power elements 4.

The on-base stepped part 32 is integrally structured with the heatsink foundation part 31 and the fins 33, and a highly conductive member of copper, aluminum or the like is used therefor. Note that, this is not limitative, and the on-base stepped part 32 may be connected as a separate part to the heatsink foundation part 31.

Meanwhile, the rib portion 11 of the power module 20 is fixed to the heatsink 16 so as to surrounds the outer periphery of the on-base stepped part 32, so that, as shown in FIG. 11, grease built-up 17 occurs in the grease 14 by means of the on-base stepped part 32 and the rib 2.

According to the power semiconductor device 40 of Embodiment 5, because of the provision of the grease built-up 17, at the time of screw-fastening the power module 20 and the heatsink 16 to each other, the grease 14 passing out of the mating face between the metal base 3 and the on-base stepped part 32, goes around up to a lateral surface 32b of the on-base stepped part 32. Thus, according to the power semiconductor device 40 of Embodiment 5, the contact area between the grease 14 and the on-base stepped part 32 increases, so that thermal conduction to the grease 14 is enhanced and thus the heat-dissipation ability is improved. Further, in the power semiconductor device 40 of Embodiment 5, the height of the on-base stepped part 32 is set large so as to prevent the rib 2 in the power module 20 from making contact with the heatsink foundation part 31 in the heatsink 16. Namely, the height of the on-base stepped part 32 is larger than the rib height h1 of the rib 2. Note that, when the ribs 2 are provided with a plurality of rib heights as in Embodiment 3, the height of the on-base stepped part 32 is larger than the highest rib height among them.

Meanwhile, in the case where the power module 20 having a convex shape shown in FIG. 15 is screw-fastened at one spot around its center, to the heatsink 16, the power module 20 acts, from the state where end portions of the power module 20 are in contact with the upper surface 32a of the on-base stepped part 32 in the heatsink 16, as if it tightens a spring by use of a screw-fastening force across the middle gap developed by the power module 20. Accordingly, in the case of the power module 20 having the convex shape, the power module 20 is deformed from the convex shape to a flat shape while keeping the metal base 3 being pressed against the grease 14 applied onto the upper surface 32a of the on-base stepped part 32 in the heatsink 16, so that the grease 14 is formed thinly. As the grease 14 becomes thinner, the thermal conductivity becomes larger and thus the heat-dissipation ability of the power module 20 is improved.

In general, a power module is screw-fixed through a grease to a heatsink. When, with this state, the power module is used continuously in a hot-cold environment, expansion and contraction occur repetitively due to a linear expansion difference between members in the power module. Thus, the power module changes from a flat state to a warped state and from warped state to a flat state, thus repetitively causing warping and flattening movement at the end side of the module. It is known that, for that reason, there occurs a pumping-out phenomenon in which the grease is discharged out from the end side of the power module, to thereby impair the heat-dissipation ability. However, with respect to the power semiconductor device 40 of Embodiment 5 equipped with the power module 20 having the convex shape, it is tightened by the screw 13 by use of the spring force of the power module 20, so that a state in which the module is pressed against the heatsink 16 is maintained, to thereby restrain the grease 14 from being discharged. When the power module 20 is upwardly convex as shown in FIG. 15, the warpage amount of the power module 20 in the screw-fastened state is from −50 to +50 μm. This warpage amount is determined for each of the cases including a case where the grease 14 is left at the center of the power module 20, a case where it is left at the both ends of the module, and the like. Also, the amount depends on the diameter of the filler in the grease 14, and is generally 50 μm or less. Here, it is assumed that, just like in FIG. 22 to FIG. 24, the direction of the warpage amount at the time of screw-fastening is "+" ("plus") when it is upward, and "−" ("minus") when it is downward, with reference to a module uppermost surface in the screw-fastening portion. "0 μm" means flat. When there is a warpage in the plus direction, the shape of the power module 20 is an M-like shape in FIG. 23, that is, a shape having a top part (a part including the measuring point p6) that is higher upward than the surface of the module in the screw-fastening portion (upper surface 10a). In contrast, when there is a warpage in the minus direction, the shape of the power module 20 is an upwardly convex shape. This is because a shape that is originally convex upward is subjected to screw-fastening. A shape with a warpage amount of −50 to 0 μm is higher in reliability than otherwise, and is thus more preferable.

According to the power semiconductor device 40 of Embodiment 5 shown in FIG. 10 to FIG. 12, the on-base stepped part 32 of the heatsink 16 is inserted toward the bottom surface 10b of the resin enclosure 7 that is placed at a position lower than the rib portion 11 of the power module 20, and toward the bottom surface of the metal base 3 (where appropriate, it is referred to as a module-inside bottom surface), and is then fastened at one point such that the screw 13 is inserted into the hole 18 formed at the center portion. Screw-fastening is done so that, in the rib 2 of the power module 20, the end of the rib 2 is positioned lower than the upper surface 32a of the on-base stepped part 32 in the heatsink 16, but does not make contact with the heatsink foundation part 31 in the heatsink 16. Thus, according to the power semiconductor device 40 of Embodiment 5, the grease built-up 17 occurs between the on-base stepped part 32 and the rib 2, so that the concern of dripping of the grease 14 is mitigated even when the product is used for a long period of time in an installed state. Further, according to the power semiconductor device 40 of Embodiment 5, since the rib 2 of the power module 20 is placed at a position not in contact with the heatsink 16, the power module 20, even though having the rib 2, can be screw-fastened in a non-floating state. The heatsink 16 is that which has been integrally manufactured with the on-base stepped part 32; however, the same effect is also achieved when it is manufactured with the on-base stepped part 32 as a separate part. When such fastening at one point is applied to the power module 100 of the comparative example without having the rib portion 11, the power module 100 is screw-fastened while being immobilized so as not to rotate. At this time, when the power module 100 is loosely immobilized, the power module 100 rotates, so that the head of the terminal in the lead frame 1 also rotates, and thus a rotation preventing jig for preventing the rotation of the power module 100 is required.

Unlike this comparative example, according to the power semiconductor device 40 of Embodiment 5, the rotation of the power module 20 is prevented in such a manner that the end side (lateral surface 32b) of the on-base stepped part 32 in the heatsink 16 makes contact with the end side of the rib 2 opposite to the on-base stepped part 32, so that no rotation preventing jig is required. According to the power semiconductor device 40 of Embodiment 5, since no rotation preventing jig is required, it is possible to easily execute assembling steps of the power semiconductor device.

Further, according to the power semiconductor device 40 of Embodiment 5, since the rib 2 of the power module 20 serves as a joist, it is possible to restrain the warpage of the module, and since the retaining member as in Patent Document 1 is not required for use, it is possible to shorten the step for fixing the power module 20 to the heatsink 16 in comparison with the power module in Patent Document 1.

Further, according to the power semiconductor device 40 of Embodiment 5, the power module 20 can be fastened using the screw 13 to the heatsink 16 at one spot in the center portion of the power module 20. As a result, according to the power semiconductor device 40 of Embodiment 5, the number of screws for fastening the power module 20 to the heatsink 16 can be reduced, namely, a smaller-size power module 20 can be mounted, so that the power semiconductor device can be downsized.

In the power semiconductor device 40 of Embodiment 5, since the power module 20 is fixed to the heatsink 16 so that its rib portion 11 surrounds the outer periphery of the on-base stepped part 32, the grease 14 will be once dammed in between the rib 2 and the on-base stepped part 32. Then, the grease 14 after flowing out of the on-base stepped part 32 in a flowing-out direction, moves along the rib 2 in a direction perpendicular to the flowing-out direction. On this occasion, because the grease 14 is subjected to a conduit resistance or a conduit curvature resistance by the rib 2 and the on-base stepped part 32, it does not easily move. Accordingly, the power semiconductor device 40 of Embodiment 5 can reduce the discharging of the grease 14 in a hot-cold environment, to thereby restrain the heat-dissipation ability of the power module 20 from decreasing.

Embodiment 6

Figure 25:
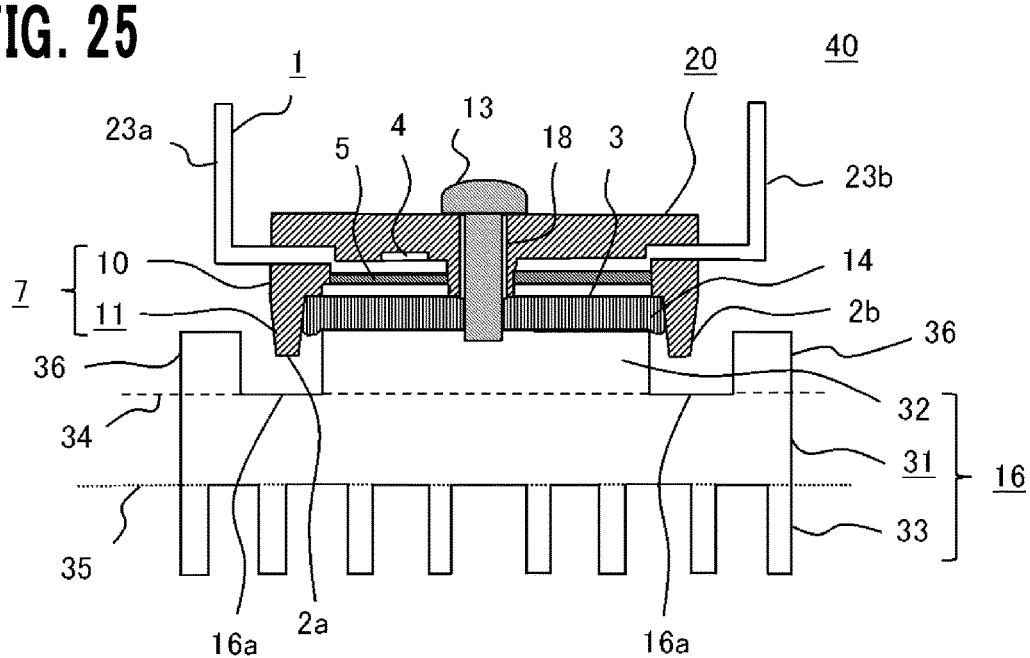
FIG. 25 is a cross-sectional view of a power semiconductor device according to Embodiment 6 of the invention.

FIG. 25 is a cross-sectional view of a power semiconductor device according to Embodiment 6 of the invention. A power semiconductor device 40 of Embodiment 6 is presented as an example in which a heatsink groove 16a, in which the rib portion 11 in the power module 20 is to be inserted, is formed in the heatsink 16. In the heatsink 16 in FIG. 25, a part placed on the inner side of the heatsink groove 16a and on the upper side of a broken line 34 is the on-base stepped part 32, and that placed on the lower side of a broken line 35 is the fins 33. In comparison with the heatsink foundation part 31 of the heatsink 16 in FIG. 10, it may be said that the heatsink foundation part 31 of the heatsink 16 in FIG. 25 has a structure provided with an outer peripheral frame 36 on the side nearer to the outer periphery thereof. The outer peripheral frame 36 is placed on the outer side of the heatsink groove 16a and on the upper side of the broken line 34. In the power semiconductor device 40 of Embodiment 6, since the heatsink groove 16a is used, the grease 14 can go into the heatsink groove 16a to be accumulated. Thus, according to the power semiconductor device 40 of Embodiment 6, it is possible to prevent a leakage of the grease 14 that occurs when the power module 20 is stood vertically. This is particularly effective for the grease 14 with low viscosity.

Embodiment 7

In the foregoing Embodiment 5 and Embodiment 6, such examples of the power semiconductor device 40 have been described in which the power module 20 is fastened using the screw 13 to the heatsink 16 at one spot in the center portion of the power module 20; however, the number of fastening spots for the power module 20 may be increased.

Figure 13:
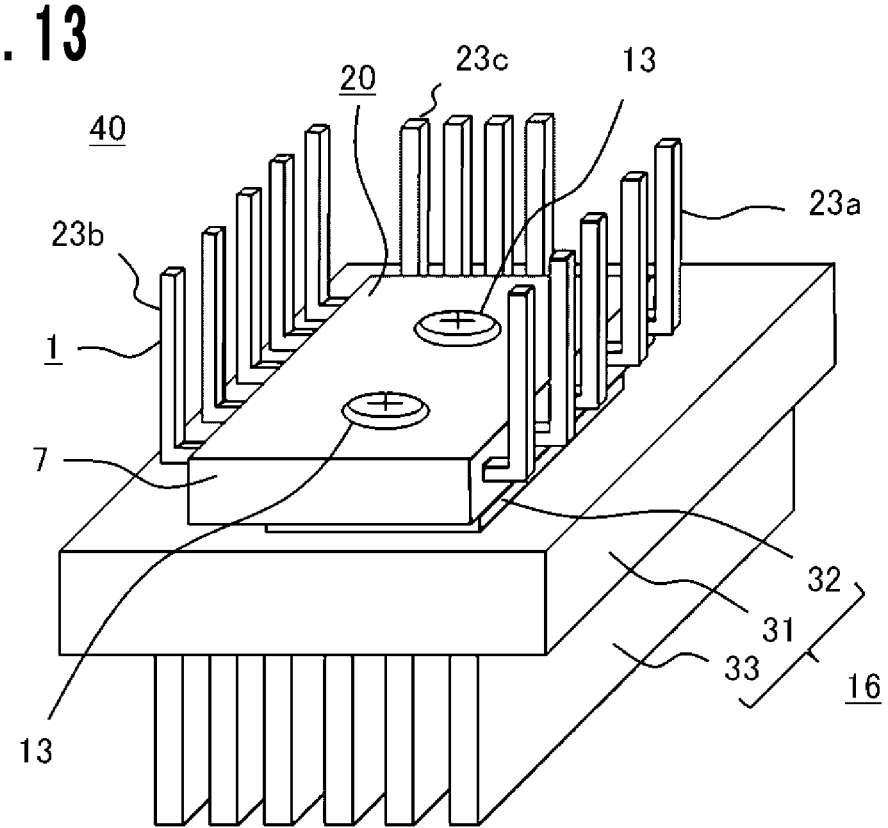
FIG. 13 is a perspective view of a power semiconductor device according to Embodiment 7 of the invention.
Figure 14:
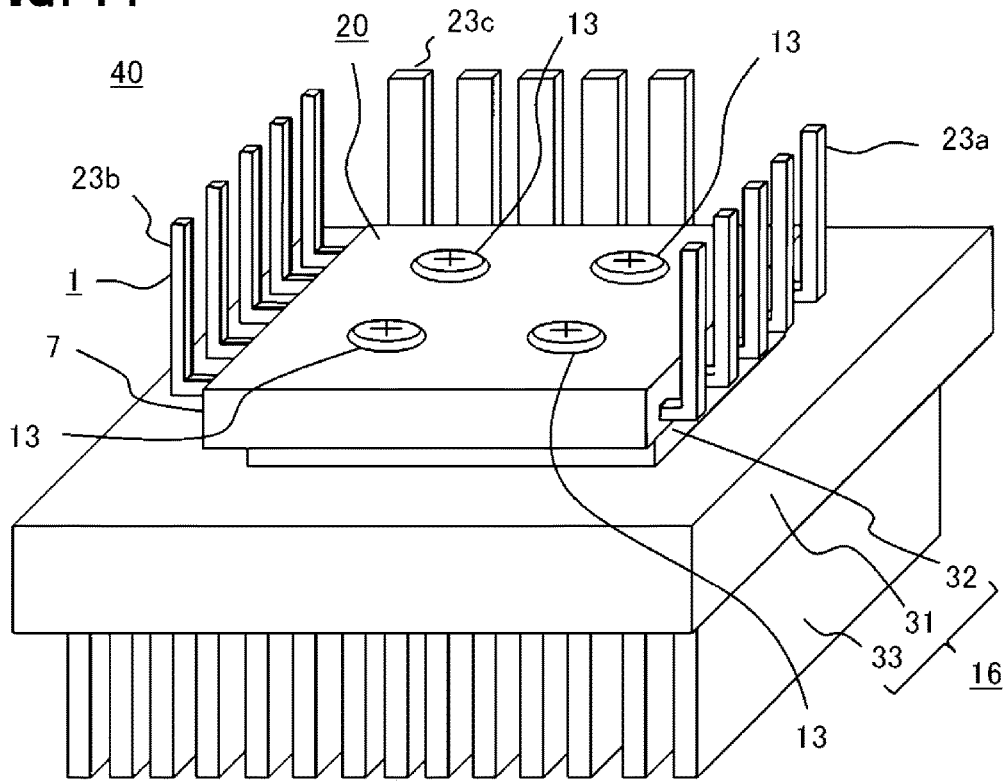
FIG. 14 is a perspective view of another power semiconductor device according to Embodiment 7 of the invention.

When there is a plurality of screws 13, the fastening spots (screw-fastening portions) for the screws 13 are desired to be placed within an area around the center of the power module 20 that is two-thirds of the power-module whole area, in such a state that the positions of the screws are line-symmetric to each other. This makes even the exposed surface of the metal base 3 in the power module 20, so that the grease thickness can be made uniform. FIG. 13 is a perspective view of a power semiconductor device according to Embodiment 7 of the invention, and FIG. 14 is a perspective view of another power semiconductor device according to Embodiment 7 of the invention. FIG. 13 is an example of the power semiconductor device 40 in which the power module 20 is screw-fastened at two spots (two points) to the heatsink 16. FIG. 14 is an example of the power semiconductor device 40 in which the power module 20 is screw-fastened at four spots (four points) to the heatsink 16. When the power module 20 is screw-fastened at two points to the heatsink 16, a fixing force for fixing together the flat bottom surface of the metal base 3 in the power module 20 and the flat upper surface 32a of the on-base stepped part 32 in the heatsink 16, is enhanced. Thus, it is possible to more restrain the pumping-out phenomenon of the power module 20, to thereby reduce the discharging of the grease 14 in a hot-cold environment, so that it is possible to restrain the heat-dissipation ability of the power module 20 from decreasing. Furthermore, when the grease 14 is high in viscosity and is thus hard, the grease does not easily move between the screw-fastening portion and the end side of the power module 20 (module's end side) and is thus stagnated. Thus, such a case may arise where the power module 20 expands at the screw-fastening portion and the module's end side.

According to the power semiconductor device 40 shown in FIG. 13, the power module 20 and the heatsink 16 are screw-fastened together at two points, so that the grease thickness can be made uniform. Note that when the power module 20 and the heatsink 16 are screw-fastened together at two or more points, the grease thickness can be made uniform.

Further, like the power semiconductor device 40 of FIG. 14, the power module 20 may be screw-fastened to the heatsink 16 at four points. It is known that, as the current flowing in the power module 20 becomes larger, the width of the terminal is made larger as shown by the terminal 23c of the lead frame 1. Like Embodiment 1, the power module 20 provided with the lead frame 1 having the large-width terminals 23c, also includes the ribs 2 which are each placed on the bottom surface 10b of the resin enclosure 7 and outside the lateral surface of the metal base 3, and are formed to protrude from the bottom surface 10b, so that it can be downsized while enhancing the insulation between the lead frame 1 and the metal base 3.

According to the power semiconductor devices 40 of Embodiments 5 to 7, when the power module 20 and the heatsink 16 are screw-fastened together at four points, it is possible to restrain similarly and more the pumping-out phenomenon of the power module 20, to thereby reduce the discharging of the grease 14.

According to the power semiconductor devices 40 of Embodiments 5 to 7, since the rib 2 of the power module 20 serves as a joist, it is possible to restrain the warpage of the module. Further, in the power semiconductor devices 40 of Embodiments 5 to 7, the power module 20 is fixed to the heatsink 16 so that its rib portion 11 surrounds the outer periphery of the on-base stepped part 32. Thus, the pumping-out phenomenon of the power module 20 that occurs in a hot-cold environment is restrained, so that it is possible to reduce the discharging of the grease 14, to thereby restrain the heat-dissipation ability of the power module 20 from decreasing.

As described above, the power semiconductor devices 40 of Embodiments 5 to 7 each comprises the power module 20 and the heatsink 16 connected through the grease 14 to the metal base 3 of the power module 20. The power module 20 comprises: the power elements 4; the metal base 3 for dissipating heat from the power elements 4; the lead frame 1 electrically connected to the electrodes of the power elements 4; and the resin enclosure 7 that encapsulates the power elements 4 so that one surface of the metal base 3 and apart of the lead frame 1 are exposed from the enclosure. The resin enclosure 7 of the power module 20 comprises: the body portion 10 in which the power elements 4 and a part of the lead frame 1 are placed, and at the bottom surface 10b of which said one surface of the metal base 3 is exposed; and the rib portion 11 which is placed on the bottom surface 10b of the body portion 10 so as to surround the outer periphery of the metal base 3, and is formed to protrude from the bottom surface of the body portion 10 in a direction perpendicular to the bottom surface 10b. The heatsink 16 of the power semiconductor device 40 is characterized in that it comprises the heatsink foundation part 31 and the on-base stepped part 32 that is connected through the grease 14 to the meal base 3, and the power module 20 is fixed to the heatsink 16 so that the rib portion 11 surrounds the outer periphery of the on-base stepped part 32. According to the power semiconductor devices 40 of Embodiments 5 to 7, since the power module 20 is fixed to the heatsink 16 so that the rib portion 11 surrounds the outer periphery of the on-base stepped part 32, the pumping-out phenomenon of the power module 20 that occurs in a hot-cold environment is restrained, so that it is possible to reduce the discharging of the grease 14, to thereby restrain the heat-dissipation ability of the power module 20 from decreasing.

Embodiment 8

Figure 26:
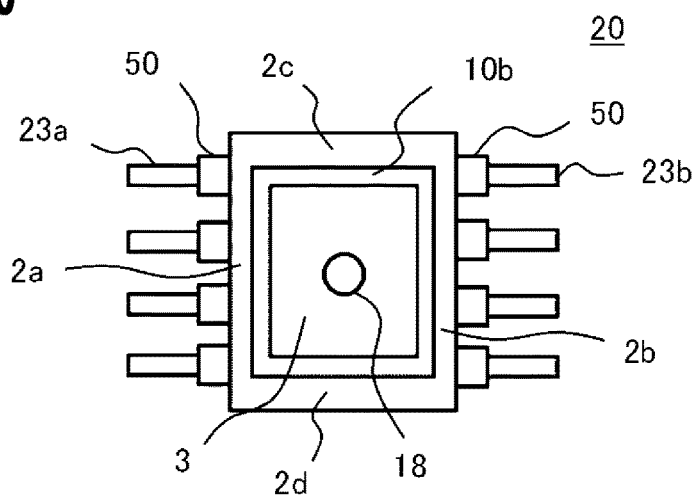
FIG. 26 is a bottom view of a power module according to Embodiment 8 of the invention, viewed from a side where a metal base is placed.

FIG. 26 is a bottom view of a power module according to Embodiment 8 of the invention, viewed from a side where a metal base is placed. A power module 20 of FIG. 26 includes resin parts 50 formed by partly covering the terminals 23a, 23b of the lead frame 1 each exposed from an edge of the resin enclosure 7, with a resin. Because of this structure, according to the power module 20 of Embodiment 8, it is possible to increase the insulation distance between the lead frame 1 and the metal base 3, thus allowing the power module 20 to be downsized.

According to the power semiconductor device 40 of Embodiment 8 which comprises the power module 20 and the heatsink 16 connected through the grease 14 to the metal base 3 of the power module 20, since the power module 20 is fixed to the heatsink 16 so that the rib portion 11 surrounds the outer periphery of the on-base stepped part 32, the pumping-out phenomenon of the power module 20 that occurs in a hot-cold environment can be restrained, so that it is possible to reduce the discharging of the grease 14, to thereby restrain the heat-dissipation ability of the power module 20 from decreasing.

Embodiment 9

Figure 27:
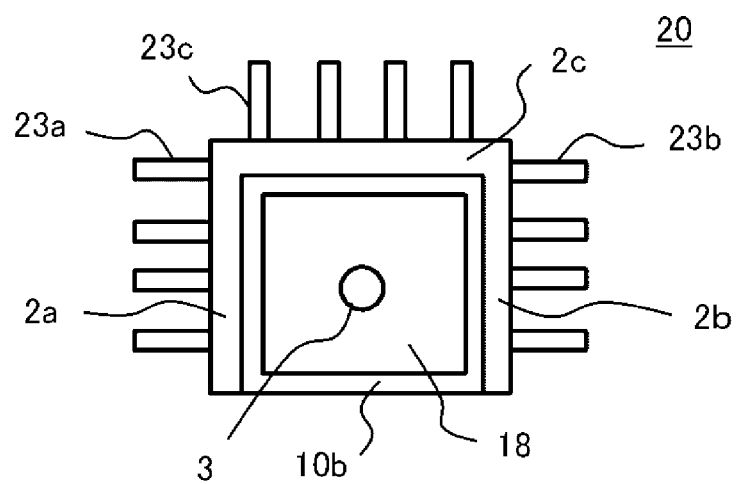
FIG. 27 is a bottom view of a power module according to Embodiment 9 of the invention, viewed from a side where a metal base is placed.

FIG. 27 is a bottom view of a power module according to Embodiment 9 of the invention, viewed from a side where a metal base is placed. A power module 20 of FIG. 27 has a structure in which no rib 2 is placed in a region where no terminal 23 of the lead frame 1 is exposed from the edge of the resin enclosure 7. In FIG. 27, such an example is shown in which three ribs 2a, 2b, 2c are formed and, at the edges of the resin enclosure 7 where these ribs 2a, 2b, 2c are formed, the respective terminals 23a, 23b, 23c are exposed. Because of this structure, according to the power module 20 of Embodiment 9, it is possible decrease the resin amount of a part that requires no insulation distance, to thereby achieve cost reduction.

According to the power semiconductor device 40 of Embodiment 9 which comprises the power module 20 and the heatsink 16 connected through the grease 14 to the metal base 3 of the power module 20, since the power module 20 is fixed to the heatsink 16 so that the rib portion 11 surrounds the outer periphery of the on-base stepped part 32, the pumping-out phenomenon of the power module 20 that occurs in a hot-cold environment is restrained, so that it is possible to reduce the discharging of the grease 14, to thereby restrain the heat-dissipation ability of the power module 20 from decreasing.

It is noted that, in the above respective Embodiments, the power element 4 mounted in the power module 20, that serves as a switching element such as an IGBT, an MOSFET or the like, or as a rectifier element such as an SBD (Schottky Barrier Diode), an FwD or the like, may be a usual element whose base member is a silicon wafer; however, a so-called wide bandgap semiconductor material may be used therefor that is wider in bandgap than silicon and is represented by silicon carbide (SiC), a gallium nitride (GaN)-based material or diamond. For example, when silicon carbide (SiC), a gallium nitride (GaN)-based material or diamond is used for the power element 4 serving as a switching element or the power element 4 serving as a rectifier element, because the power loss is lower than that of a conventionally-used element formed of silicon (Si), the efficiency of the power module 20 can be enhanced. Further, because the withstanding voltage is high and the allowable current density is also high, the power module 20 can be downsized. Furthermore, because the wide bandgap semiconductor element has high heat resistance, it is operable at a high temperature. This allows the heatsink 16 to be downsized and the water cooling unit to be substituted with an air cooling one, so that the power semiconductor device 40 provided with the heatsink 16 can be further downsized.

It should be noted that unlimited combination of the respective embodiments, and any appropriate modification and omission in the embodiments may be made in the present invention to the extent without creating contradiction.

DESCRIPTION OF REFERENCE NUMERALS AND SIGNS

1: lead frame, 2, 2a, 2b, 2c, 2d: rib, 3: metal base, 4: power element, 7: resin enclosure, 10: body portion, 10b: bottom surface, 11: rib portion, 13: screw, 14: grease, 16: heatsink, 16a: heatsink groove, 18: hole, 20: power module, 26: rib foundation part, 27: protruding part, 31: heatsink foundation part, 32: on-base stepped part, 40: power semiconductor device, 50: resin part, 51: frame-contacting region, 51a: frame-contacting-region upper side, 51b: frame-contacting-region bottom side, 60: intermediate-product assembly, 62: mold, 65a, 65b: terminal opening, 66: metal-base placement part, 67a, 67b: pin opening, 69: rib-end forming part, 71: ejector pin, 101: depression, h1, h4, h6: rib height, wb1, wb2: rib-base width, hm8: body-portion upper-side height, hm9: body-portion rib-side height.

The invention claimed is:

1. A power module which comprises a power element, a metal base for dissipating heat from the power element, a lead frame electrically connected to electrodes of the power element, and a resin enclosure that encapsulates the power element so that one surface of the metal base and a part of the lead frame are exposed from the enclosure, said resin enclosure comprising:
a body portion in which the power element and a part of the lead frame are placed, and at a bottom surface of which said one surface of the metal base is exposed; and
a rib portion which is placed on the bottom surface of the body portion so as to surround an outer periphery of the metal base, and is formed to protrude from the bottom surface of the body portion in a direction perpendicular to the bottom surface, the rib portion extending lower than said one surface of the metal base;
wherein the rib portion has a depression at its end overhanging from the bottom surface.

2. The power module of claim 1, wherein, in the rib portion, a rib-portion height that is a height from the bottom surface of the body portion to an end which is farthest from the bottom surface of the body portion, is larger than a connection width in a transverse cross-section with which the rib portion is connected to the bottom surface of the body portion.

3. The power module of claim 1, wherein, in the rib portion, its shape in a transverse cross-section that is a cross-section perpendicular to the bottom surface of the body portion is a taper shape in which a connection width with which the rib portion is connected to the bottom surface of the body portion is larger than an end width of an end overhanging from the bottom surface.

4. The power module of claim 1, further comprising an insulating sheet located between the lead frame and the metal base.

5. The power module of claim 1, wherein the rib portion has a plurality of ribs, and
wherein the plurality of ribs are placed at a same height so as to surround the exposed one surface of the metal base.

6. The power module of claim 1, wherein the rib portion has a plurality of ribs, and
wherein, with respect to at least one of the ribs, a rib height that is a height from the bottom surface of the body portion to an end of that rib which is farthest from the bottom surface of the body portion, is lower than the rib height with respect to the other one of the ribs.

7. A power semiconductor device which comprises the power module of claim 1, and which further comprises a heatsink having an on-base stepped part, wherein a space is formed between the on-base stepped part and the rib portion.

8. The power module of claim 1, wherein, in the resin enclosure, the bottom surface of the body portion forms a quadrilateral shape having long sides and short sides;
wherein the rib portion has a plurality of ribs;
wherein two of the plurality of ribs are long-side ribs that are placed peripherally on the bottom surface at the respective long sides;
wherein the other two of the plurality of ribs are short-side ribs that are placed peripherally on the bottom surface at the respective short sides; and
wherein a connection width in a transverse cross-section of the long-side rib, with which the long-side rib is connected to the bottom surface of the body portion, is larger than a connection width in a transverse cross-section of the short-side rib, with which the short-side rib is connected to the bottom surface of the body portion.

9. The power module of claim 1, wherein terminals provided as the part of the lead frame exposed from the resin enclosure, are each partly covered by a resin part.

10. The power module of claim 1, wherein the resin enclosure includes the rib portion on the bottom surface correspondingly to a region where the part of the lead frame is exposed.

11. The power module of claim 1, wherein, in the resin enclosure, a length in a direction perpendicular to the bottom surface of the resin enclosure, which is provided between a frame-contacting-region bottom side that is placed in a frame-contacting region from which the lead frame is getting exposed and on a side toward the bottom surface, and the exposed surface of the metal base, is shorter than a length in a direction perpendicular to the bottom surface of the resin enclosure, which is provided between a frame-contacting-region upper side that is placed in the frame-contacting region on a side toward an upper surface of the resin enclosure that is opposite to the bottom surface, and the upper surface.

12. The power module of claim 1, wherein the power element is formed of a wide bandgap semiconductor material.

13. The power module of claim 12, wherein the wide bandgap semiconductor material is silicon carbide, a gallium nitride-based material or diamond.

14. A power semiconductor device which comprises the power module of claim 1, and a heatsink connected through a grease to the metal base of the power module,
wherein the heatsink comprises a heatsink foundation part and an on-base stepped part that is connected through the grease to the metal base, and
wherein the power module is fixed to the heatsink so that the rib portion surrounds an outer periphery of the on-base stepped part.

15. The power semiconductor device of claim 14, wherein the power module has a through-hole that penetrates the metal base from an upper surface opposite to the bottom surface, and
wherein the power module is fixed to the on-base stepped part of the heatsink by means of a screw inserted in the through-hole.

16. The power semiconductor device of claim 14, wherein the power module has a through-hole that penetrates the metal base from an upper surface opposite to the bottom surface,
wherein the heatsink has a groove in which the rib portion of the power module is to be inserted, and
wherein the rib portion of the power module is inserted in the groove of the heatsink and the power module is fixed to the heatsink by means of a screw inserted in the through-hole.

17. The power semiconductor device of claim 15, wherein, in the power module, the through-hole is formed singularly at its center.

18. A power module manufacturing method of manufacturing the power module of claim 1, wherein, in a rib-end forming part of the mold at which the end of the rib portion overhanging from the bottom surface of the resin enclosure is to be formed, a plurality of pin openings in which pins for ejecting the resin enclosure are to be inserted are formed;
said power module manufacturing method comprising:

a step of placing an intermediate-product assembly which comprises the power element, the metal base and the lead frame, in a mold so that the metal base is in contact with its metal-base placement part and a part of the lead frame is exposed from the mold;

a step of forming the resin enclosure by injecting a transfer-mold resin into the mold in a state in which the pin openings are closed with the pins; and a step of forming depressions in the rib portion in such a manner that, at the time the resin enclosure is ejected from the mold, the pins are inserted beyond the pin openings up to a depth that is larger than a width in a transverse direction of the end of the rib portion, so that the pins push out the rib portion of the resin enclosure.

19. The power module manufacturing method of claim 18, wherein, in the mold, a length in a direction perpendicular to the bottom surface of the resin enclosure, which is provided between the metal-base placement part with which the metal base is to be in contact, and an opening one-side that is placed on a side toward the metal base in an opening of the mold through which the lead frame is to be exposed, is shorter than a length in a direction perpendicular to the bottom surface of the resin enclosure, which is provided between an inner surface of the mold at which an upper surface of the power module opposite to the bottom surface is to be formed, and the opening one-side.

20. A power module which comprises a power element, a metal base for dissipating heat from the power element, a lead frame electrically connected to electrodes of the power element, and a resin enclosure that encapsulates the power element so that one surface of the metal base and a part of the lead frame are exposed from the enclosure, said resin enclosure comprising:

a body portion in which the power element and a part of the lead frame are placed, and at a bottom surface of which said one surface of the metal base is exposed; and a rib portion which is placed on the bottom surface of the body portion so as to surround an outer periphery of the metal base, and is formed to protrude from the bottom surface of the body portion in a direction perpendicular to the bottom surface;

wherein the rib portion has a depression at its end overhanging from the bottom surface, wherein the rib portion comprises a rib foundation part connected to the bottom surface of the body portion, and a protruding part which is placed on an end of the rib foundation part overhanging from the bottom surface of the body portion, and is formed to protrude in a direction perpendicular to the bottom surface of the body portion.

21. The power module of claim 20, wherein, in the rib foundation part, its shape in a transverse cross-section that is a cross-section perpendicular to the bottom surface of the body portion, is a taper shape in which a connection width with which the rib foundation part is connected to the bottom surface of the body portion is larger than a width of a rib-foundation-part end that is an end overhanging from the bottom surface; and wherein, in the protruding part, its shape in a transverse cross-section that is a cross-section perpendicular to the bottom surface of the body portion is a taper shape in which a connection width with which the protruding part is connected to the rib foundation part is larger than a width of a protruding-part end that is an end overhanging from the rib-foundation-part end.

22. A power module which comprises a power element, a metal base for dissipating heat from the power element, a lead frame electrically connected to electrodes of the power element, and a resin enclosure that encapsulates the power element so that one surface of the metal base and a part of the lead frame are exposed from the enclosure, said resin enclosure comprising:

a body portion in which the power element and a part of the lead frame are placed, and at a bottom surface of which said one surface of the metal base is exposed, wherein the body portion is warped into an upwardly convex shape with respect to said exposed one surface of the metal base as a vertical reference; and a rib portion which is placed on the bottom surface of the body portion so as to surround an outer periphery of the metal base, and is formed to protrude from the bottom surface of the body portion in a direction perpendicular to the bottom surface;

wherein the rib portion has a depression at its end overhanging from the bottom surface.

* * * * *